(12) United States Patent
Sato et al.

(10) Patent No.: US 7,535,083 B2
(45) Date of Patent: May 19, 2009

(54) LEAD FRAME FOR SURFACE MOUNT-TYPE PIEZOELECTRIC VIBRATOR

(75) Inventors: Masayuki Sato, Chiba (JP); Atsushi Kamiyama, Chiba (JP); Junji Teraya, Chiba (JP); Kazunori Ishii, Chiba (JP); Satoshi Shimizu, Chiba (JP)

(73) Assignee: Seiko Instruments Inc. (JP)

( * ) Notice: Subject to any disclaimer, the term of this patent is extended or adjusted under 35 U.S.C. 154(b) by 365 days.

(21) Appl. No.: 11/362,313

(22) Filed: Feb. 24, 2006

(65) Prior Publication Data

US 2006/0192635 A1  Aug. 31, 2006

(30) Foreign Application Priority Data

| Feb. 25, 2005 | (JP) | ............................. 2005-051313 |
| Feb. 28, 2005 | (JP) | ............................. 2005-054174 |
| Feb. 28, 2005 | (JP) | ............................. 2005-054175 |
| Feb. 28, 2005 | (JP) | ............................. 2005-054176 |
| Feb. 22, 2006 | (JP) | ............................. 2006-045202 |

(51) Int. Cl.
    *H01L 23/495* (2006.01)
(52) U.S. Cl. ....................................... 257/666; 257/676
(58) Field of Classification Search ................. 257/666, 257/676, 670
See application file for complete search history.

(56) References Cited

U.S. PATENT DOCUMENTS

| 5,302,921 | A | * | 4/1994 | Shigemori et al. ............ 331/67 |
| 5,463,247 | A | * | 10/1995 | Futatsuka et al. ........... 257/666 |
| 5,592,130 | A | * | 1/1997 | Ikeda et al. ................. 331/158 |
| 5,608,359 | A | * | 3/1997 | Knecht et al. ................. 331/68 |
| 7,291,905 | B2 | * | 11/2007 | Hirasawa et al. ............ 257/686 |
| 7,345,411 | B2 | * | 3/2008 | Sato et al. ................... 310/365 |
| 2007/0080610 | A1 | * | 4/2007 | Sato et al. ................... 310/348 |

OTHER PUBLICATIONS

Patent Abstracts of Japan, publication No. 2001-077278, publication date Mar. 23, 2001.
Patent Abstracts of Japan, publication No. 11-298279, publication date Oct. 29, 1999.
Patent Abstracts of Japan, publication No. 2002-067081, publication date Mar. 5, 2002.
Patent Abstracts of Japan, publication No. 03-082052, publication date Apr. 8, 1991.

* cited by examiner

*Primary Examiner*—S. V Clark
(74) *Attorney, Agent, or Firm*—Adam & Wilks

(57) ABSTRACT

A lead frame has a pair of side frames each having a plurality of positioning holes and spaced apart from each other in a width direction of the lead frame. At least one section bar extends between the pair of side frames. First lead sections extend from the section bar and are arranged at predetermined intervals along the width direction of the lead frame. Second lead sections extend from the section bar along the width direction of the lead frame and are disposed in confronting and spaced-apart relation to the respective first lead sections in a longitudinal direction of the lead frame to define a frame area extending between the pair of side frames. Each of the second lead sections has a pair of separate and independent protruding portions disposed adjacent one another.

25 Claims, 21 Drawing Sheets

FIRST ROW | SECOND ROW | THIRD ROW | FOURTH ROW

ELECTRODE TERMINAL SIDE — ODD-NUMBER ROW — DUMMY TERMINAL SIDE | ELECTRODE TERMINAL SIDE — EVEN-NUMBER ROW — DUMMY TERMINAL SIDE

CS: STRAY CAPACITY

32768Hz QUARTZ CRYSTAL VIBRATOR

LEAD FRAME FOR SURFACE MOUNT-TYPE PIEZOELECTRIC VIBRATOR

BACKGROUND OF THE INVENTION

1. Field of the Invention

The present invention relates to a lead frame and a method for producing a surface mount type piezoelectric vibrator using the same, a resin mold construction of a piezoelectric vibrator, a surface mount type piezoelectric vibrator, and an oscillator, an electronic unit and a wave timepiece each having the same.

2. Description of the Related Art

Piezoelectric vibrators are indispensable to the production of industrial products such as watches, oscillators, and electronic units. Piezoelectric vibrators are used as timekeeping sources, timing sources or reference sources for signals. Piezoelectric vibrator packages commonly used include cylinder-type packages. The configuration of a cylinder-type package piezoelectric vibrator will be described below with reference with drawings.

FIG. 31 is an exploded perspective view showing the configuration of a cylinder-type package piezoelectric vibrator. As shown in FIG. 31, a cylinder-type package piezoelectric vibrator 6 has a piezoelectric vibrating piece 4 bonded to an inner lead 2 inside an airtight terminal 1 having two lead terminals. The piezoelectric vibrating piece 4 is made of piezoelectric material such as quartz crystal and formed to be shaped like a tuning fork through photolithography technology. The tuning-fork type piezoelectric vibrating piece 4 is formed with an exciting electrode 4a on the surface of each of two vibrating arm portions thereof. Amount electrode 7 connected to the exciting electrode 4a is formed on the surface of the airtight terminal 1 side of the piezoelectric vibrating piece 4.

The piezoelectric vibrating piece 4 is bonded to the inner lead 2 inside the airtight terminal 1 through the mount electrode 7. The inner lead 2 passes through the airtight terminal 1, serving as an outer lead 3. The inner lead 2 and the outer lead 3 together is referred to as a lead terminal. At the outside perimeter of the airtight terminal 1, the tuning-fork type piezoelectric vibrating piece 4 is covered with a cylindrical bottomed metal sealing tube 5 so that the airtight terminal 1 is airtight sealed to form a vacuum inside.

When predetermined voltage, as drive voltage, is applied to the two outer leads 3, the cylinder-type package piezoelectric vibrator configured as described above permits current to flow from the inner lead 2 through the mount electrode 7 to the exciting electrode 4a. This thus causes the piezoelectric vibrating piece 4 to oscillate at a predetermined frequency.

Unlike other electronic parts, the cylinder-type package piezoelectric vibrator 6 as described above cannot be surface mounted as it is using an automatic mounting machine. The cylinder-type package piezoelectric vibrator 6 is covered with resin to allow surface mounting using an automatic mounting machine. This resin-covered type of cylinder-type package piezoelectric vibrator is known as a surface mount type piezoelectric vibrator.

FIGS. 32 and 33 are views describing a surface mount type piezoelectric vibrator. FIG. 32 is a perspective appearance view of a surface mount type piezoelectric vibrator and FIG. 33 is a schematic cross-sectional view showing the inside construction of a surface mount type piezoelectric vibrator with resin cut off.

As shown in FIGS. 32 and 33, a surface mount type piezoelectric vibrator 31 has a cylinder-type package piezoelectric vibrator 6 provided in the middle. An electrode terminal 33 is provided at the tip side of an outer lead 3 for mounting onto an external substrate. The electrode terminal 33 is formed to extend from a lead frame 60. The electrode terminal 33 is shaped like a crank. One end of the electrode terminal 33 is to be bonded to the outer lead 3 while the other end is to be mounted on a substrate. The electrode terminal 33 is disposed so that the portion that is to be mounted on a substrate is directed outward of the surface mount type piezoelectric vibrator 31.

A surface mount type piezoelectric vibrator 31 manufacturing process includes a process for bonding an outer lead 3 of a vibrator 6 to an electrode terminal 33, a resin mold process for coating the cylinder-type package piezoelectric vibrator 6 with resin, a cutting process for separating a portion connecting a lead frame 20 to a resin mold portion from the lead frame 20, and a process for performing an electrical test on the surface mount type piezoelectric vibrator 31.

[Process for Bonding an Outer Lead to an Electrode Terminal]

In a process for bonding an outer lead to an upper electrode terminal, a vibrator 6 is first carried into each space portion located inside a lead frame through a predetermined transfer tool capable of holding the vibrator 6. The outer lead 3 is brought into contact with and the upper electrode terminal of the electrode terminal 33 and voltage is applied to both, thereby bonding both to each other.

As shown in FIGS. 34 and 35, a lead frame 60 for a conventional surface mount type piezoelectric vibrator has side frames 61 of a carrying and positioning section, section bars 62 and arrangement areas 64 for vibrators 6. These individual components are provided across the width of the lead frame 60 in two rows. Arrangement areas 64 for vibrators 6 are partitioned by a frame 63 for supporting electrode terminals 33 into two rows. Typically, these side frames and sections bars are generically called frame bars.

In the arrangement area 64 for the vibrator 6, a pair of electrode terminals 33 protrude from the side frame 61. A dummy terminal 32 also protrudes from a frame 63 for support the lead frame so that the dummy terminal 32 faces the electrode terminal 33. These terminals, the electrode terminal 33 and the dummy terminal 32, are disposed to face each other across the width of the lead frame 60. As shown in FIG. 35, a plurality of positioning through holes 65 are provided at predetermined intervals in each of the carrying and positioning side frames 61 of the lead frame 60.

The outer lead 3 of the vibrator 6 and the electrode terminal 33 are aligned with the above conventional lead frame 60 for welding purposes in a manner described below. A positioning reference block (not shown) is first prepared. The positioning reference block has a plurality of positioning pins for positioning the lead frame 60 provided to stand up at constant intervals in association with welding positions. The positioning reference block is aligned with the lead frame 60 by inserting the plurality of positioning pins into the plurality of corresponding positioning through holes 65 of the lead frame 60. This causes the outer lead 3 of the vibrator 6 to be aligned with the electrode terminal 33 for welding purposes.

To weld outer leads 3 of the vibrator 6 to electrode terminals 33, vibrators 6 are then disposed in areas 64 in the lead frame 60 provided for arranging plurality of vibrators 6. The outer lead 3 is then placed on the upper electrode terminal 33c of the lead frame 60, as shown in FIG. 37. Welding is performed by placing both the outer lead 3 and the upper electrode terminal 33c between an upper bonding electrode 37 and an lower bonding electrode 36 and applying voltage to the bonding electrodes 36, 37.

[Resin Mold Process]

A conventional resin mold process for a surface mount type piezoelectric vibrator 31 will be described below. A surface mount type piezoelectric vibrator 31 has a sealing tube in the middle thereof. An electrode terminal for mounting on an external substrate is provided on the tip side of an outer lead. The electrode terminal is formed to extend from a lead frame. The electrode terminal is formed like a crank. One end of the electrode terminal is to be bonded to the outer lead 3 while the other end is to be mounted on a substrate. The surface mount type piezoelectric vibrator 31 has the portion to be mounted on a substrate disposed to face outward.

In the resin mold process for the surface mount type piezoelectric vibrator 31, a vibrator 6 is coated with resin mold material at a resin-molded section formed inside a lead frame 60 space. The resin-molded section is formed of molds. The vibrator 6 is held between an upper mold and a lower mold for resin molding.

In a surface mount type package, burs called place thickness burs of a lead frame 60 are produced on the sides of the package and prevent an increase in outside dimensions of the package. In the surface mount type package, as shown in FIGS. 34 to 36, it is known that molds for resin mold are placed in blocks each shaped by a side frame 61 and a section bar 62 formed to surround the outside perimeter of the package and a frame 63 for supporting lead terminals for molding to form the shape of the external sides of each package.

Mold resin material is poured into the molds with a piezoelectric vibrator held between a contact portion formed on the top surface of the lower mold and the inside of the upper mold for molding purposes. This forms surface mount type piezoelectric vibrators 31 each having a resin mold portion as shown in FIG. 32 in arrangement areas 64 of the lead frame 60 for a plurality of vibrators.

[Process for Cutting Electrode Terminal Portions]

In a process for cutting electrode terminal portions, each of the dummy terminals 32 and the electrode terminals 33 connecting to the surface mount type piezoelectric vibrators 31 on the lead frame 60 are cut in predetermined positions. This separates individual surface mount type piezoelectric vibrators 31 from the lead frame 60.

[Electrical Test Process]

An electrical test process for the surface mount type piezoelectric vibrator 31 has required more measurement time in response to measurement items for guaranteeing performance characteristics of the surface mount type piezoelectric vibrator 31 and a measurement accuracy in recent years. Much time is therefore spent on the electrical test.

The electrical test process involves separating individual surface mount type piezoelectric vibrators 31 from the lead frame 60 after resin mold and carrying, positioning and electrically inspecting individual surface mount type piezoelectric vibrator 31 to distinguish between non-defective and defective vibrators. Characteristics of surface mount type piezoelectric vibrators 31 are classified according to users' applications.

Surface mount type piezoelectric vibrators 31 are loaded on tapes and the like according to types such as different load capacity as serial equivalent static capacity and frequency deviation, which completes the surface mount type piezoelectric vibrator 31 manufacturing process.

The longer measurement time is, the more accurate frequency measurements for vibrators 6 will be. The higher the accuracy required is, the longer measuring time will therefore be.

For the electrical test method described above, a method is known which involves bringing electrical contact terminals into contact with the electrode terminals for simultaneous batch electronic part measurement.

The surface mount type piezoelectric vibrator 31 manufacturing method described above, however, has problems in individual manufacturing processes.

[Process for Bonding an Outer Lead to an Electrode Terminal]

The process involves bonding the outer lead 3 of the surface mount type piezoelectric vibrator 31 to the upper electrode terminal 33c by bringing the outer lead 3 into contact with the upper electrode terminal 33c for electrical continuity and applying voltage. The process have problems that will be described below. Particularly such a boding method has problems described below in properly aligning the lead frame 60 with the vibrator 6.

The aforementioned alignment requires the successful alignment of three points, a turning angle difference θ for the outer lead 3, a bonding position for electrical continuity with the outer lead 3, and the position of the cutting end of the outer lead 3.

In other words, as shown in FIGS. 37 and 38, the alignment of these three points include a turning angle difference θ between a pair of two upper electrode terminals 33c and the outer lead 3, the alignment of a bonding point 33d located in the middle of the upper electrode terminal 33c with a required bonding point in the bent outer lead 3, and the handling of the length of the terminal of the outer lead 3 between the upper electrode terminal 33 and the contour of the piezoelectric vibrator. The alignment of these three points will be described below in detail.

1. The length of the part of the outer lead 3 that protrudes from the airtight terminal 1 is smaller than the contour of the sealing tube 5 of the vibrator 6. Even about a few scores of grams of load also result in the plastic deformation of the outer lead 3. Therefore, it is difficult to regulate the turning angle difference θ for the outer lead 3 with an external force. Although, therefore, the turning angle difference θ for the outer lead 3 is regulated with the dead weight of the vibrator 6, the turning angle difference θ is actually too small for alignment and a required positional accuracy is not met in some cases.

2. The bonding point 33d located in the middle of the electrode terminal 33 is coincided with a required bonding point in the bent outer lead 3. In a process for bending the outer lead 3 in advance, misalignment of the turning angle difference θ for the outer lead 3 results in an insufficient bend in the outer lead 3, thus making impossible the alignment of the required bonding point in some cases.

3. As described earlier, even a small load results in the plastic deformation of the outer lead 3. It is therefore difficult to directly regulate the length and position of the terminal of the outer lead 3 with a jig and the like. Thus, conventional positioning means having a radiused (curved) surface corresponding to the cylindrical side of the vibrator 6 is provided for alignment using the shapes of the sealing tube 5 and the airtight terminal 1 in the longitudinal direction of the vibrator 6. In a process for sealing the sealing tube 5 and the airtight terminal 1, however, there is a dimensional deviation in the longitudinal direction of the vibrator 6 with a resultant deviation in the cutting accuracy for the outer lead 3, thus making the above alignment insufficient in some cases.

Particularly machining using a transfer jig will make it impossible to proceed with subsequent processes properly under any of the above-mentioned situations.

In addition, an insufficient alignment of the sealing tube 5 described above can result in warpage in the lead frame 60 in the longitudinal direction thereof because of the contact of the dummy terminal 32 facing the electrode terminal 33 with the sealing tube 5 on the lead frame 60. Any warpage in the lead frame 60 makes it possible to proceed with subsequent processes properly when the lead frame 60 is mechanically carried and aligned.

In the resin molding process that follows the bonding process descried above, an incorrect alignment of the vibrator 6 in molds also results in not only problematic electrode terminal 33 bonding. The incorrect alignment also results the problematic partial exposure of the vibrator 6 from mold resin the resultant incorrect formation of the periphery of the vibrator 6.

[Resin Mold Process]

The resin molding process for a conventional surface mount type piezoelectric vibrator 31 has problematic points as described below.

1. The size and arrangement of a mold 66 for molding the periphery of each of vibrators 6 out of resin in the lead frame 60 are as shown in FIG. 39. The mold 66 is long in the longitudinal direction of the lead frame 60.

Each of the vibrators 6 in the lead frame 60 has the longitudinal side thereof disposed across the width of the lead frame 60 as shown in FIG. 35.

The material of the lead frame 60 is conductive material such as an iron-containing alloy. An iron-containing alloy is also used for molds for resin molding. The lead frame 60 and these molds are made of the same iron-containing materials. However, each of these materials has a different coefficient of linear expansion. In resin molding, the mold 66 for resin molding and the lead frame 60 are heated to temperatures between 150 and 180° C.

The difference in coefficient of linear expansion between the mold 66 for resin molding and the lead frame 60 causes a misalignment between the mold 66 for resin molding and the lead frame 60. The misalignment appears in the longitudinal direction of the lead frame 60 can easily appear across the width of the surface mount type piezoelectric vibrator 31.

The contour of the resin-molded surface mount type piezoelectric vibrator 31 and the shape of the electrode terminal 33 in the lead frame 60 causes misalignment therebetween due to the above-mentioned difference in coefficient of linear expansion from the center of the surface mount type piezoelectric vibrator 31 and across the width thereof. The misalignment results in a difference in size of the electrode terminal 33 across the width of the surface mount type piezoelectric vibrator 31. In the electrode terminal 33 cutting process after the resin molding process, the ends of electrode terminal 33 are cut off from the lead frame 60. The difference in size of the electrode terminal 33 across the width of the surface mount type piezoelectric vibrator 31 can cause contact of a cutting punch with the mold resin thereof, thus resulting in problematic resin chips due to lead cutting. As described above, the resin chipping resulting from resin molding has an adverse influence on the product performance of the surface mount type piezoelectric vibrator 31.

2. The electrical test process for the surface mount type piezoelectric vibrator 31 have required more measurement time because of measurement items for guaranteeing performance characteristics of the surface mount type piezoelectric vibrator 31 and a measurement accuracy in recent years. Much time is therefore spent on the electrical test. Individual surface mount type piezoelectric vibrators 31 are problematically difficult to handle so as to guarantee the performance characteristics thereof.

To ensure the characteristics and reliability of the surface mount type piezoelectric vibrator 31, a resin mold construction is therefore required for the surface mount type piezoelectric vibrator 31. The resin mold construction would allow measurements of the surface mount type piezoelectric vibrator 31 on the lead frame 60 in the electric test and the simultaneous quick batch measurements of more surface mount type piezoelectric vibrators 31. The time reduction would enable resulting saved time to be allocated to measurements for performance characteristic measurement items for measurement accuracy guarantee, thus making it possible to ensure a higher reliability and a higher quality.

3. For the above purpose, a higher cavity density is required for the resin mold construction, which would allow electrical tests performed on the lead frame 60 and allow for the layout of the lead frame 60 for simultaneous batch contact of more electrode terminals. However, the higher cavity density would result in a problematically complicate mold for the resin mold construction.

In other words, contact surface of the mold are inserted between the resultant outer peripheral portion of the above-mentioned resin mold construction to be shaped to enclose the vibrator 6 and the side of the vibrator 6. The outer peripheral portion shaped to enclose the vibrator 6 to support the positional accuracy of a terminal formation portion is to be disposed on the side of the vibrator 6 as a frame 63 for supporting the section bar 62 and the lead terminal. In the mold 66 for forming cavities, therefore contact surfaces between the outer peripheral portion to be shaped to enclose the vibrator 6 and the side of the vibrator 6 and between a section bar 62 and the mold 66 are formed for each cavity. Resin burrs resulting from resin molding include thin burrs produced on the sides of the package and the top surface of the lead frame from a mold clamping clearance between the upper mold and lower mold. To allow the removal of these thin burrs, a mold clamping clearance accuracy is required, as far as thin burrs can be removed, in a position where the contour of the package is to be shaped and in positions of section bars 62. To make a plurality of adjacent cavities closer to one another for a higher cavity density, a sufficient strength is therefore required for narrower section bars 62 and the mold. The mold must also be of a complicated shape that would avoid the shape of section bars 62 together with the maintenance of the accuracy of individual mold clamping clearances.

[Process for Cutting Electrode Terminal Portions]

In the process for cutting electrode terminal portions of the surface mount type piezoelectric vibrator 31, a notch groove is sometime formed in advance in each cutting point in advance for cutting load reduction. As an adverse influence of this, warpage in the lead frame 60 sometimes results. In other words, the formation of notch grooves in the lead frame 60 can lead to the expansion of notch groove formation surfaces, thus resulting in warpage in these surfaces. Any warpage in the lead frame 60 will make it impossible to proceed with subsequent processes properly when the lead frame is mechanically carried and aligned.

[Electrical Test Process]

The electrical test process for the surface mount type piezoelectric vibrator 31 suffer from problems described below. Particularly the back measurement of surface mount type piezoelectric vibrators 31 each having the electrode terminal 33 in contact with the outer lead 3 for electrical continuity suffers from problems described below.

1. A limited number of electronic parts are measured all together in the electrical test method that involves bringing electrical contact terminals into contact with electronic parts mounted in a row on the side frame at a right angle.

2. As shown in FIGS. 35 and 36, on a conventional lead frame 60, piezoelectric vibrators 6 are mounted in two rows at a right angle to the longitudinal direction of two side frames 61 (in the vertical direction in FIG. 35). This requires section bars 62 bridging between the side frames 61 or the frame 63 for supporting lead terminals, and the like. As shown in FIG. 35, there is a limit to the arrangement of piezoelectric vibrators 6 at shorter intervals for a higher density and a limited number of piezoelectric vibrators 6 are measured all together.

3. If, on the other hand, a plurality of surface mount type piezoelectric vibrators 31 are arranged at shorter intervals for a high density and driven to oscillate, the oscillating condition of adjacent surface mount type piezoelectric vibrators 31 and their intervals can affect their oscillation frequency.

FIG. 40 is a diagram showing the oscillation circuit of a common piezoelectric vibrator. CS, represented by a dashed line, refers to stray capacity. FIG. 41 is a graph showing a relation between the load capacity of a common piezoelectric vibrator and frequency deviation. The axis of abscissas CGOUT shows a load capacity while the axis of ordinates shows frequency deviation. It is well known that the oscillation frequency varies with the magnitude of the capacitor CG in FIG. 40, as in the graph shown in FIG. 41. It is also well known that the stray capacity is proportional to the area of wiring connected with the oscillation circuit and inversely proportional to the distance.

It is known from the above fact that the frequency of piezoelectric vibrators 6 also vary between adjacent surface mount type piezoelectric vibrators 31 to be measured in the electrical test process for surface mount type piezoelectric vibrators 31. The distance between adjacent surface mount type piezoelectric vibrators 31 has a different influence on the frequency of the surface mount type piezoelectric vibrator 31. If an attempt is made to meet the necessity of enhancing the layout density of the lead frame relative to the lead frame 60 on which more electrical contact terminals are brought into contact with electronic parts as described above, piezoelectric vibrators 6 can be affected by the influence of the frequencies of piezoelectric vibrators 6 oscillating each other due to the distance between adjacent surface mount type piezoelectric vibrators 31, thus making it difficult to make correct frequency measurements.

The problems described above are aggregately caused by the lead frame 60, which constrains requirements in the surface mount type piezoelectric vibrator 31 manufacturing process.

SUMMARY OF THE INVENTION

A first object of the present invention is to provide a surface mount type piezoelectric vibrator lead frame that allows the proper alignment and bonding of an outer lead and an electrode terminal and sure electrical connection without any adverse influence on the lead frame such as warpage in a process for bonding the outer lead and the electrode terminal to each other in a surface mount type piezoelectric vibrator manufacturing process and the like, to eliminate the problems described above and ensure characteristics and reliability of the surface mount type piezoelectric vibrator.

A second object of the invention is to provide a resin mold construction that can eliminate resin chipping in an electrode end portion cutting process, which results from a resin mold construction in the surface mount type piezoelectric vibrator manufacturing process, and a lead frame that allows the resin mold construction. It is also to provide a resin mold construction that makes it possible to bring an electrical contact terminal into contact with electrode terminals of a plurality of surface mount type piezoelectric vibrators and to simultaneously measure and test more of a plurality of surface mount type piezoelectric vibrators all together quickly for low costs without complicating resin molding molds with higher cavity density, and a lead frame that allows the resin mold construction.

A third object of the invention is to provide a surface mount type piezoelectric vibrator lead frame that can eliminate lead frame deformation in a cutting process of a surface mount type piezoelectric vibrator manufacturing process.

A fourth object of the invention is to provide a lead frame for a surface mount type piezoelectric vibrator that allows the maximization of electrical contact terminals brought into contact with surface mount type piezoelectric vibrators having two-directional lead terminals arranged in a matrix at short pitches on a section bar with high density through the effective use of a width ⅓ to ⅕ smaller than a length and the simultaneous measurement of these vibrators all together with a quick measurements of individual vibrators, in an electrical test process of a surface mount type piezoelectric vibrator manufacturing process. It is also to provide a lead frame for a surface mount type piezoelectric vibrator manufacturing process that makes it possible to simultaneously testing more of the surface mount type piezoelectric vibrators with electrical contact terminals in contact with a plurality of surface mount type piezoelectric vibrators arranged with high density without repeated electrical contact terminal contacts, and without any influence on the frequency of adjacent vibrators, and allocate resulting saved time to measurements for performance characteristic measurement items for measurement accuracy guarantee, thus allowing reliability and quality improvements and uses the lead frame.

A fifth object of the invention is provide a surface mount type piezoelectric vibrator that is manufactured by a surface mount type piezoelectric vibrator manufacturing method using a lead frame according to the invention and small-sized with a reliable stable quality.

A sixth object of the invention is provide an oscillator, an electronic unit, and a wave timepiece each using a surface mount type piezoelectric vibrator according to the invention.

When the above description is summarize, these objects of the invention are to provide a lead frame that allows the mass production of small-sized and reliable surface mount type piezoelectric vibrators having a stable quality with space saving and a surface mount type piezoelectric vibrator manufacturing method using the lead frame and to provide a surface mount type piezoelectric vibrator manufactured by means of the manufacturing method and an oscillator, an electronic unit, and a wave timepiece each using the surface mount type piezoelectric vibrator.

To achieve the above objects, the present invention includes the aspects described below.

According to a first aspect of the invention, there is provided a lead frame comprising a pair of side frames each having a plurality of positioning holes, a section bar bridging between the pair of side frames, a frame area partitioned by the side frames and the section bar, a plurality of first lead sections arranged at predetermined intervals and each extended from the section bar, and a plurality of second lead sections facing the first lead sections and extended from the section bar, wherein the pair of first lead sections and the pair of second lead sections are each arranged across the width of the lead frame, and wherein the pair of the first lead sections face the pair of second lead sections in a longitudinal direction of the lead frame.

In the configuration according to the first aspect of the invention, no frames for supporting individual lead sections are provided in the frame area partitioned by the side frame and the section bar. Only the first and second lead sections are provided in the frame area. A lead frame that makes the most of a space in the frame can be provided.

The first and second lead sections are directed in the longitudinal direction of the lead frame and supported by the section bars arranged across the width of the lead frame having no wasteful frames and a minimum configuration. The surface mount type piezoelectric vibrator is characterized in that the width is ⅓ to ⅕ smaller than the length. Surface mount type piezoelectric vibrators are directed in the longitudinal direction of the lead frame and arranged across the width of the lead framer thereby providing a lead frame that allows the surface mount type piezoelectric vibrators to be disposed in a matrix with high density.

The first and second lead sections having a minimum configuration are provided in the frame area. This allows a plurality of cavities to be provided at shorter intervals, which cavities form the outer peripheral portion of the lead frame formed to surround the surface mount type piezoelectric vibrators. This prevents molds from being complicate and provides a lead frame that can have a high cavity density resin mold construction that allows cavities to be disposed with high density.

The longitudinal directions of the first and second lead sections and the cavities are directed toward the side frame while the piezoelectric vibrators are arranged in the direction of the section bar. This makes difficult for surface mount type piezoelectric vibrators to be influenced by mold center misalignment, which conventionally occurs the longitudinal direction of the side frame. Therefore, a lead frame can be provided that have a resin mold construction that allows the elimination of resin chipping resulting from lead cutting in a process for cutting the first and second lead sections. Resin chipping is caused by the above center misalignment for surface mount type piezoelectric vibrators.

In addition, a plurality of surface mount type piezoelectric vibrators each having two-directional lead terminals can be arranged at short pitches with high density on the section bar having a minimum configuration with no wasteful frame, in a matrix over the lead frame. A lead frame can therefore be provided that permits the largest possible number of electrical contact terminals to be measured all together, which terminals are to be brought into contact with the piezoelectric vibrators.

According to a second aspect of the invention, there is provided a lead frame having tips of the plurality of first lead sections adjoining each other connected to each other, the first protruding portion being provided in the middle of the tips connected to each other.

According to a third aspect of the invention, there is provided a lead frame having a plurality of second protruding portions facing the first protruding portion provided at tips of the plurality of second lead sections, the second protruding portions of the plurality of second protruding portions that adjoin each other being independent of each other.

According to a fourth aspect of the invention, there is provided a lead frame having a vertical portion provided at the first protruding portion.

According to a fifth aspect of the invention, there is provided a lead frame having a vertical portion and a horizontal portion provided at the second protruding portion.

The lead frame having a configuration according to the second to fifth aspects of the invention is preferable for surface mount type piezoelectric vibrators. This is because a vertical portion is formed at the first protruding portion and a bend portion shaped like a crank composed of a vertical portion and a horizontal portion is formed at the second protruding portion having two branching tips, the second lead section functioning. It is also because surface mount type piezoelectric vibrators can be disposed with high density across the width of the lead frame since the length of the surface mount type piezoelectric vibrator is smaller than the width. The lead frame is also preferable for the measurement of the surface mount type piezoelectric vibrators all together. This is because more measurement items and more measurement time for measurement accuracy conventionally require more measurement time for performance characteristic guarantee, thus resulting in a lot of time spent on testing.

According to a sixth aspect of the invention, there is provided a lead frame having a through hole provided on a centerline connecting the center of the first lead section and the center of the second lead section facing the first lead section.

According to the sixth aspect of the invention, a through hole is provided on a centerline connecting the centers of the first and second lead sections. The lead frame is therefore preferable for easy slit machining between from the tips the first and second lead sections to the centers of the first and second lead sections frame up to the through hole on the lead frame. This permits frame rigidity to be maintained for the first and second lead sections and the first and second lead sections are individually formed after slit machining.

According to a seventh aspect of the invention, there is provided a method for manufacturing a surface mount type piezoelectric vibrator using the above lead frame and a piezoelectric vibrator having a lead terminal and a sealing tube, the method comprising a bonding process for bonding the lead terminal of the piezoelectric vibrator to the second lead section of the lead frame, a resin molding process for molding a periphery of the piezoelectric vibrator out of resin including at least a portion of the first lead section and the second lead section, a cutting process for separating the second lead section from the lead frame, and an electrical test process for supporting the piezoelectric vibrator with the first lead section and bringing an electrical contact terminal into contact with the second lead section separated to perform an electrical test on the piezoelectric vibrator.

According to the seventh aspect of the invention, a surface mount type piezoelectric vibrator has characteristically a width that is ⅓ to ⅕ smaller than the length thereof. Each of the surface mount type piezoelectric vibrator has two-directional terminals: one terminal functions as an electrode terminal and the other is an electrically completely independent dummy terminal. The surface mount type piezoelectric vibrators can be arranged on the section bar having a minimum configuration with no wasteful frame, in a matrix with high density over the entire lead frame. A surface mount type piezoelectric vibrator manufacturing method can be provided that allows the largest possible number of electrical contact terminals to be brought into contact with these piezoelectric vibrators and enables the surface mount type piezoelectric vibrators to be electrically tested all together with quick testing for each of the vibrators.

According to an eighth aspect of the invention, there is provided a method for manufacturing a surface mount type piezoelectric vibrator having a periphery a piezoelectric vibrator a cylindrical sealing tube molded out of resin, the method comprising the steps of using a lead frame composed of conductive material, and arranging a plurality of the piezoelectric vibrators with a distance between the piezoelectric vibrators adjoining each other smaller than a width of the surface mount type piezoelectric vibrator in a one frame area on the lead frame.

According to the eighth aspect of the invention, a plurality of piezoelectric vibrators are disposed in a frame area on a lead frame and the distance between piezoelectric vibrators adjoining each other is smaller than the width of the surface mount type piezoelectric vibrator. More surface mount type piezoelectric vibrators can therefore be produced per the unit area of the lead frame.

According to a ninth aspect of the invention, there is provided a method for manufacturing a surface mount type piezoelectric vibrator having a periphery a piezoelectric vibrator a cylindrical sealing tube molded out of resin, the method comprising the steps of using a lead frame composed of conductive material, and arranging a plurality of the piezoelectric vibrators with a distance between the piezoelectric vibrators adjoining each other smaller than a diameter of the cylindrical sealing tube in a one frame area on the lead frame.

According to the ninth aspect of the invention, a plurality of piezoelectric vibrators are disposed in a frame area on a lead frame and the distance between piezoelectric vibrators adjoining each other is smaller than the diameter of a sealing tube. Further more surface mount type piezoelectric vibrators can therefore be produced per the unit area of the lead frame.

According to a tenth aspect of the invention, there is provided a method for manufacturing a surface mount type piezoelectric vibrator formed of a piezoelectric vibrator having a piezoelectric vibrating piece bonded to an airtight terminal with a lead terminal and sealed by a cylindrical bottomed metal sealing tube, a lower electrode terminal connected to an external electrode, an upper electrode terminal bent from the lower electrode terminal to provide electrical continuity with an outer lead outside the airtight terminal, a dummy terminal disposed to face the lower electrode terminal, and mold resin for coating the piezoelectric vibrator therewith, the method comprising a bonding process for bonding the outer lead to an upper electrode terminal by bringing the outer lead into contact with the upper electrode terminal for electrical continuity and applying voltage, wherein in the bonding process, a plurality of pairs of at least two cuts each generally equal to the diameter of the outer lead are provided on one of long sides, wherein the outer lead is held in a rectangular thin plate with an interval for the pairs of cuts large disposed to be larger than a width of the piezoelectric vibrator, the rectangular thin plate being aligned with an outer lead with the dummy terminal and the electrode terminal, and wherein the rectangular thin plate is aligned with and brought into contact with a lead frame formed with the dummy terminal and the electrode terminal to properly position and bond the outer lead of the piezoelectric vibrator to the electrode terminal.

According to the tenth aspect of the invention, each two outer leads are inserted into cuts each generally equal to the diameter of the outer lead and constrained and held so that the airtight terminals are unable to move from a carriage pallet. The intervals at which cuts are provided are provided to larger than the width of the piezoelectric vibrator between each two cuts in the rectangular thin plate. This allows turning angle difference to be controlled to be small for the outer lead, thus making it possible to meet required positional accuracy for the outer lead.

In other words, a small of the position of the outer lead results in the plastic deformation of the outer lead with a small load, thus making it difficult to control the turning angle with a direct external force. However, the turning angle for the outer lead is controlled by means of cuts disposed at intervals each larger than the width of the piezoelectric vibrator. This allows the turning angle for the outer lead to be controlled relative to the contour of the sealing tube of the piezoelectric vibrator, thus making it possible to meet required positional accuracy.

The positional accuracy for the cuts in the rectangular thin plate into which the outer leads are inserted can easily be provided by means of a general-purpose precision processing machine that provides a processing accuracy of a few μm as in a dicing machine, for example. Therefore it is possible to meet positional accuracy required for alignment using the cuts. In addition, the turning angle for the outer lead and the positions of the cuts in the rectangular thin plate can be obtained with high accuracy. The outer lead can be bend into a required shape and required bonding points can be coincided with each other after bending.

The outer leads inserted into and disposed on the rectangular thin plate are aligned with the lead frame high accuracy through the highly accurate alignment of the rectangular thin plate with the lead frame, on which the dummy terminals and electrode terminals are formed. The highly accurate alignment ensures accuracy in alignment with the contour of the sealing tubes of the piezoelectric vibrators. This can prevent adverse influences, such as warpage in the lead frame due to unwanted contact of the contour of the sealing tube with the lead frame. The outer leads of the piezoelectric vibrators can be positioned properly on the lead frame by brining outer leads highly accurately aligned into contact with the lead frame.

According to an eleventh aspect of the invention, in the method according to the tenth aspect of the invention, one or more dummy terminals extending from a section bar at appropriate intervals and a plurality of electrode terminals facing the dummy terminals and extending at the same intervals as the dummy terminals are provided in a frame area partitioned by a pair of side frames having a plurality of positioning holes and the section bar, the section bar bridging between the pair of side frames. The tip of the dummy terminal is connected to an adjacent lead section and a protruding portion is formed at a central portion, the tip of the electrode terminal being divided into two molds, each forming a protruding portion. The electrode terminal of the lead frame and the outer lead of the piezoelectric vibrator attached to the rectangular thin plate are arranged in a same position and the outer lead is laid on, transferred to, and bonded to the electrode terminal bonded, relative to the lead frame, the lead frame having the dummy terminal and the electrode terminal directed in a longitudinal direction of the lead frame and arranged across a width thereof.

According to the eleventh aspect of the invention, one or more dummy terminals extending from a section bar at appropriate intervals and a plurality of electrode terminals facing the dummy terminals and extending at the same intervals as the dummy terminals are provided in a frame area partitioned by a pair of side frames having a plurality of positioning holes and the section bar, the section bar bridging between the pair of side frames. The tip of the dummy terminal is connected to an adjacent lead section and a protruding portion is formed at a central portion, the tip of the electrode terminal being divided into two molds, each forming a protruding portion. The rectangular thin plate is aligned with the lead frame with the dummy terminals and the electrode terminals directed in the longitudinal direction thereof and arranged across the width thereof, thereby resulting in the highly accurate alignment of the plurality of outer leads arranged. The outer leads of the piezoelectric vibrators attached to the rectangular thin plate are arranged in the same position as the electrode terminals are arranged on the lead frame, thereby resulting in the highly accurate simultaneous alignment of the plurality of outer leads arranged with a single alignment of the rectangular thin plate. The outer leads are laid on, transferred to, and bonded to the electrode terminals bonded, thereby allowing simultaneous high-accuracy stable bonding.

In addition, the rectangular thin plate is easy to align in terms of shape and is preferable for machine processing using a transfer jig.

According to a twelfth aspect of the invention, in the method according to the tenth or eleventh aspect of the invention, in a process for bonding the outer lead to the upper electrode terminal by bringing the outer lead into contact with the upper electrode terminal for electrical continuity and applying voltage, the outer lead is irradiated with laser and cut to separate the piezoelectric vibrator from the rectangular thin plate.

According to the twelfth aspect of the invention, the outer lead of the piezoelectric vibrator is positioned on and bonded to the lead frame. The tip of the outer lead can then be irradiated with laser with the lead frame as a reference and cut to separate the piezoelectric vibrator from the pallet. Therefore, the tip of the outer lead does not suffer from a deviation in the length of the piezoelectric vibrator or a deviation in outer lead cutting accuracy including the above deviation. This thus allows the terminal of the outer lead to be handled with required positional accuracy.

The terminal of the outer lead can handled with required positional accuracy, which helps to reduce the length of the surface mount type piezoelectric vibrator.

According to a thirteenth aspect of the invention, there is provided a method for manufacturing a surface mount type piezoelectric vibrator formed of a piezoelectric vibrator sealed by a cylindrical bottomed metal sealing tube with a piezoelectric vibrating piece bonded to an airtight terminal having a lead terminal, an electrode terminal connected to an external electrode for providing electrical continuity with the lead terminal, a dummy terminal disposed to face the electrode terminal, and mold resin for coating the piezoelectric vibrator therewith, the method comprising the steps of separating a plurality of the electrode terminals relative to the surface mount type piezoelectric vibrator supported by a section bar and molded out of resin with the electrode terminal and the dummy terminal facing each other in a longitudinal direction of the side frame and arranged in a longitudinal direction of the section bar in a frame area partitioned by a pair of side frames having a plurality of positioning holes and the section bar, the section bar bridging between the pair of side frames, and bringing an electrical contact terminal into contact with a plurality of electrode terminal rows on the surface mount type piezoelectric vibrator side supported by the dummy terminal and performing an electrical test on the section bar.

According to the thirteenth aspect of the invention, only the electrode terminal and the dummy terminal are provided arranged in a frame area partitioned by a pair of side frames having a plurality of positioning holes and the section bar bridging between the pair of side frames. There are no other frames between any two surface mount type piezoelectric vibrators arranged, thus allowing surface mount type piezoelectric vibrators to be disposed making the most of the space in the frame area.

The electrode terminal and the dummy terminal are directed in the direction of the side frame and arranged in the direction of the section bar. This allows a plurality of surface mount type piezoelectric vibrators each having two directional terminals to be directed in the direction of the side frame, arranged in the direction of the section bar, and disposed on the section bar.

The surface mount type piezoelectric vibrator has characteristically a width that is ⅓ to ⅕ smaller than the length thereof. Each of the surface mount type piezoelectric vibrator has two-directional terminals: one terminal functions as an electrode terminal and the other is an electrically completely independent dummy terminal. The surface mount type piezoelectric vibrators can be arranged on the section bar having a minimum configuration with no wasteful frame, in a matrix with high density over the entire lead frame. This is preferable for bringing the largest possible number of electrical contact terminals into contact with the piezoelectric vibrators. This allows more electrical contact terminals to be brought into contact with these piezoelectric vibrators simultaneously and enables the surface mount type piezoelectric vibrators to be electrically tested all together with quick testing for each of the vibrators.

According to a fourteenth aspect of the invention, in the method according to the thirteenth aspect of the invention, an electrical contact terminal is brought into contact with a plurality of the electrode terminal rows on the surface mount type piezoelectric vibrator side supported by the dummy terminal on the section bar. Drive voltage applied and the surface mount type piezoelectric vibrator is driven, alternately changing a level of the drive voltage for driving every other of the surface mount type piezoelectric vibrators to alternately perform an electrical test on the every other of the surface mount type piezoelectric vibrators.

According to the fourteenth aspect of the invention, a plurality of surface mount type piezoelectric vibrators are arranged in a matrix at short pitches on the section bar with high density. Drive voltage is applied and the plurality of surface mount type piezoelectric vibrators with electrical contact terminals id contact with the surface mount type piezoelectric vibrators without repeated electrical contact terminal contacts. A level of the drive voltage for driving every other of the surface mount type piezoelectric vibrators is alternately changed to alternately perform an electrical test on the every other of the surface mount type piezoelectric vibrators. This makes it possible to greatly reduce electrical test time for the surface mount type piezoelectric vibrators without any influence on the frequency of adjacent vibrators.

In other words, the surface mount type piezoelectric vibrator moves to a normal frequency after a slight vibration much quickly than reaches a stable frequency after the start of drive voltage application. With this characteristic, the adjacent surface mount type piezoelectric vibrator is caused to continue to drive with slight vibrations at a low level of drive voltage applied to prevent the surface mount type piezoelectric vibrator being measured from being affected by the frequency of the adjacent one. The use of a normal drive voltage application level allows the reduction of time before frequency stabilization. Resulting saved time can be allocated to measurement items for performance characteristic guarantee and measurement accuracy, thus allowing the manufacture of the surface mount type piezoelectric vibrators with improved reliability and quality.

According to a fifteenth aspect of the invention, there is provided a piezoelectric vibrator resin mold construction for simultaneously molding the peripheries of a plurality of individual piezoelectric vibrators out of resin, the construction comprising a lead frame formed with a plurality of frame areas for fixing the plurality of piezoelectric vibrators in the plurality of frame areas, and a mold formed with a plurality of cavities surrounding peripheries of the plurality of individual piezoelectric vibrators fixed to the lead frame and divided into two molds to hold the lead frame therebetween.

According to the fifteenth aspect of the invention, a plurality of frame areas are formed on one lead frame. A plurality of piezoelectric vibrators are fixed in the plurality of frame areas. The use of divided molds with a plurality of cavities allows the reduction in intervals at which individual piezoelectric vibrators are disposed, which are surrounded by the cavities. Therefore, a large number of piezoelectric vibrators can be disposed with high density in a limited space and the peripheries of many of these piezoelectric vibrators can be molded out of resin at one time.

According to a sixteenth aspect of the invention, there is provided a resin mold construction for simultaneously molding a plurality of individual piezoelectric vibrators out of resin, the construction comprising a lead frame formed with a plurality of frame areas for fixing the piezoelectric vibrators in the frame areas, a mold formed with a plurality of cavities surrounding peripheries of the piezoelectric vibrators fixed to the lead frame and divided into two molds to hold the lead frame therebetween, wherein longitudinal directions of the piezoelectric vibrators, the lead frame and the mold are in the same direction as one another.

According to the sixteenth aspect of the invention, longitudinal directions of the piezoelectric vibrators, the lead frame and the mold are in the same direction. Even if, therefore, each of the piezoelectric vibrator, lead frame, and mold undergoes thermal expansion on heating, misalignment between the piezoelectric vibrator and the mold due to different coefficients of thermal expansion can be minimized. Misalignment between the piezoelectric vibrator and the mold can therefore be minimized even across the width of the piezoelectric vibrator, thus eliminating resin chipping in the lead cutting process after resin molding.

According to a seventeenth aspect of the invention, there is provided a piezoelectric vibrator resin mold construction for simultaneously molding a plurality of individual piezoelectric vibrators out of resin, the construction comprising a lead frame formed with a plurality of frame areas for fixing the plurality of piezoelectric vibrators in the plurality of frame areas, and a mold formed with a plurality of cavities surrounding peripheries of the plurality of individual piezoelectric vibrators fixed to the lead frame and divided into two molds to hold the lead frame therebetween, wherein longitudinal directions of the piezoelectric vibrators, the lead frame and the mold are in the same direction.

The construction according to the seventeenth aspect of the invention combines the constructions according to the fifteenth and sixteenth aspects of the invention. A large quantity of high-quality surface mount type piezoelectric vibrators can therefore be manufactured without resin chipping in a limited space at one time.

According to an eighteenth aspect of the invention, in the piezoelectric vibrator resin mold construction according to any of the fifteenth to seventeen aspects of the invention, the plurality of piezoelectric vibrators fixed to the lead frame are supported by a plurality of first lead sections formed in the frame area on the lead frame and a plurality of second lead sections formed in the frame area to face the plurality of first lead sections.

According to an eighteenth aspect of the invention, individual piezoelectric vibrators are supported by the lead sections and firmly arranged and fixed when the periphery thereof is molded out of resin. In addition, the thin lead sections are cut and piezoelectric vibrators and resin are not subjected to large loads. Therefore, a large quantity of surface mount type piezoelectric vibrators with higher quality can be manufactured in a limited space at one time.

According to a nineteenth aspect of the invention, in the piezoelectric vibrator resin mold construction according to the fifteenth to eighteen aspect of the invention, one flat surface only is formed for a location in the frame area where either one of divided molds is located.

According to the nineteenth aspect of the invention, a location in the frame area where either one of divided molds is located, that is, a portion that surrounds the outside perimeter of the piezoelectric vibrator, is formed of one flat surface. Molds are not of a complicated shape and durable enough to fully withstand accumulated thermal stressed due to repeated heat. In addition, the contact surface of the other mold that is put together with the flat-surface mold can be simplified and thus durable. Therefore, these molds allow a large quantity of high-quality surface mount type piezoelectric vibrators to be manufactured in a limited space at one time and over a long period of time.

According to a twentieth aspect of the invention, in the piezoelectric vibrator resin mold construction according to any of the fifteenth to nineteenth aspects of the invention, the cavities are formed in only either one of the divided molds.

According to the twentieth aspect of the invention, the plurality of cavities are formed in one mold, into which molding resin is poured. This facilitates and simplifies forming an injection molding port for pouring resin into individual cavities therethrough and a runner for running resin through the injection molding port. The runner can also be shortened, thus resulting in improvements in resin use efficiency.

In the present invention, a resin mold construction can be provided which allows cavities to be arranged in non-complicate molds at short pitches with high density molds are not complicated and adjacent cavities are provided at shorter pitches and with good space efficiency.

In other words, only the first and second lead sections are provided in the frame area of the lead frame partitioned by the side frame and the section bar. There are no other frames between surface mount type piezoelectric vibrators disposed in the frame area on a lead frame having a minimum configuration. Therefore, molds having the plurality of cavities can make the most of the space in the frame area. With no other frames, the cavities are connected with one another through a single flat surface. Adjacent cavities are provided at short pitches and the first and second lead sections are directed in the direction of the side frame with the cavities disposed in the longitudinal direction thereof. This permits surface mount type piezoelectric vibrators to be arranged with good space efficiency, which vibrators characteristically has a width that is ⅓ to ⅕ smaller than a length. Injection molding ports are provided toward the first and second lead sections at a runner disposed on the section bar. This allows the formation of a mold construction that provides the largest cavity density and resin use rate with the shortest runner per cavity on the section bar having a minimum configuration with no wasteful frames.

The first and second lead sections and the longitudinal direction of the cavities are in the direction of the side frame while the piezoelectric vibrators are arranged in the direction of the section bar. This permits mold center misalignment to appear in the misalignment-insensitive longitudinal direction of the surface mount type piezoelectric vibrator, while mold center misalignment conventionally appears in the longitudinal direction of the side frame. Therefore, a resin mold construction can be provided that can eliminate resin chipping due to the center misalignment for the surface mount type piezoelectric vibrator in the process for cutting the first and second lead sections.

In the invention, the tip of the first lead section is also connected to an adjacent lead section to form a protruding portion at the central portion. The tip of the second lead section is divided into two portions. On the lead frame with protruding portions, the piezoelectric vibrators an electrode terminal of the second lead section providing electrical continuity with an outer lead and connected to an external electrode, and a dummy terminal of the first lead section disposed to face the electrode terminal are included for resin molding.

According to the invention, it is possible to mold a surface mount type piezoelectric vibrator out of resin that includes the piezoelectric vibrator, an electrode terminal of the second lead section providing electrical continuity with an outer lead and connected to an external electrode, and a dummy terminal of the first lead section disposed to face the electrode terminal.

Surface mount type piezoelectric vibrators each having characteristically a width that is ⅓ to ⅕ smaller than the length thereof can be molded out of resin with two-directional terminal as a terminal that functions as an electrode terminal and the other as an electrically completely independent dummy terminal at short pitches on the section bar having a minimum configuration with no wasteful frames in a matrix with high density over the entire lead frame. The resin mold construction is preferable for bringing the largest possible number of electrical contact terminals into contact with surface mount type piezoelectric vibrators in the electrical test process. This makes it possible to provide a surface mount type piezoelectric vibrator manufacturing method that allows more electrical contact terminals to be brought into contact with these piezoelectric vibrators simultaneously and enables the surface mount type piezoelectric vibrators to be electrically tested all together with quick testing for each of the vibrators.

According to a twenty-first aspect of the invention, there is provided a piezoelectric vibrator resin mold construction for molding peripheries of plurality of individual piezoelectric vibrators fixed to a lead frame out of resin, said construction comprising an injection molding port for the resin for the plurality of piezoelectric vibrators disposed in odd-number rows and an injection molding port for the resin for the plurality of piezoelectric vibrators disposed in even-number rows, wherein the plurality of piezoelectric vibrators are all disposed in the same back-and-forth direction in a plurality of rows on the lead frame, and wherein the injection mold ports are disposed in back-and-forth directions different from each other.

In the resin mold construction according to the twenty-first aspect of the invention, the front side of an injection molding port alternates with the rear side according to a piezoelectric vibrator row difference. Surface mount type piezoelectric vibrators can therefore be directed in the same direction without increasing the volume of a resin supply line. In the electrical test process following the resin molding process, electrical tests can therefore be perform with good efficiency without changing the direction of surface mount type piezoelectric vibrators or electrical contact terminals.

According to a twenty-second aspect of the invention, there is provided a surface mount type piezoelectric vibrator manufactured by the surface mount type piezoelectric vibrator manufacturing process according to any of the seventh to fourteenth aspects of the invention.

In the surface mount type piezoelectric vibrator according to the twenty-second aspect of the invention, a small size, high reliability and stable quality can be ensured. Units mounting the surface mount type piezoelectric vibrator can be made smaller and more reliable.

According to a twenty-third aspect of the invention, there is provided an oscillator with the surface mount type piezoelectric vibrator according to the twenty-second aspect of the invention connected to an integrated circuit as an oscillation piece. A smaller and reliable oscillator can be provided.

According to a twenty-fourth aspect of the invention, there is provided an electronic unit having the surface mount type piezoelectric vibrator according to the twenty-second aspect of the invention connected to a timing section. A smaller and reliable electronic unit can be provided.

According to a twenty-fifth aspect of the invention, there is provided a wave timepiece having the surface mount type piezoelectric vibrator according to the twenty-second aspect of the invention connected to a filter section. A smaller and reliable wave timepiece can be provided.

As described above, according to the present invention, a surface mount type piezoelectric vibrator lead frame can be provided that allows the proper alignment and bonding of an outer lead and an electrode terminal and sure electrical connection without any adverse influence on the lead frame such as warpage in a process for bonding the outer lead and the electrode terminal to each other in a surface mount type piezoelectric vibrator manufacturing process and the like.

In addition, a lead frame for surface mount type piezoelectric vibrator can be provided that is allowed by a resin mold can eliminate resin chipping in an electrode end portion cutting process, which results from a resin mold construction in the surface mount type piezoelectric vibrator manufacturing process. A lead frame for a surface mount type piezoelectric vibrator that is allowed by a resin mold construction that makes it possible to bring an electrical contact terminal into contact with electrode terminals of a plurality of surface mount type piezoelectric vibrators and to simultaneously measure and test more of a plurality of surface mount type piezoelectric vibrators all together quickly for low costs without complicating resin molding molds with higher cavity density and a surface mount type piezoelectric vibrator manufacturing method can be provided.

A surface mount type piezoelectric vibrator lead frame can be provided that can eliminate lead frame deformation in a cutting process of a surface mount type piezoelectric vibrator manufacturing process.

A lead frame for a surface mount type piezoelectric vibrator can be provided that allows the maximization of electrical contact terminals brought into contact with surface mount type piezoelectric vibrators having two-directional lead terminals arranged in a matrix at short pitches on a section bar with high density through the effective use of a width ⅓ to ⅕ smaller than a length and the simultaneous measurement of these vibrators all together with a quick measurements of individual vibrators, in an electrical test process of a surface mount type piezoelectric vibrator manufacturing process. A lead frame for a surface mount type piezoelectric vibrator and a surface mount type piezoelectric vibrator manufacturing method can be provided, each of which makes it possible to simultaneously testing more of the surface mount type piezoelectric vibrators with electrical contact terminals in contact with a plurality of surface mount type piezoelectric vibrators arranged with high density without repeated electrical contact terminal contacts, and without any influence on the frequency of adjacent vibrators, and allocate resulting saved time to measurements for performance characteristic measurement items for measurement accuracy guarantee, thus allowing reliability and quality improvements.

According to the invention, a turning angle for a pair of two upper electrode terminals and the outer lead is regulated by a plurality of cuts in a rectangular thin plate, thus meeting a positional accuracy required for the positional accuracy of the outer lead. This provides a turning angle difference for the outer lead and a high positional accuracy of the plurality of cuts in the rectangular thin plate. The outer lead can be bent into a required shape, thus allowing the coincidence of required bonding points. The electrode terminals of the lead frame is arranged in the same manner as the outer leads on the rectangular thin plate. Therefore, a stable positional accuracy guaranteed by the lead frame and the rectangular thin plate can be ensured and stable bonding can be obtained. The tip of the outer lead can then be irradiated with laser with the lead frame as a reference and cut to separate the piezoelectric vibrator from the rectangular thin plate. The terminal of the outer lead can therefore be handled with required positional accuracy.

A surface mount type piezoelectric vibrator lead frame manufacturing method can also be provided that ensures the proper alignment of piezoelectric vibrator and an outer lead for terminal formation, electrical connection, the characteristics and reliability of a surface mount type piezoelectric vibrator.

According to the invention, in an electrical test process of a surface mount type piezoelectric vibrator manufacturing process, electrical contact terminals brought into contact with surface mount type piezoelectric vibrators having two-directional lead terminals arranged in a matrix at short pitches on a section bar with high density can be maximized through the effective use of a width $\frac{1}{3}$ to $\frac{1}{5}$ smaller than a length and these vibrators can be measured all together simultaneously with a quick measurements of individual vibrators.

A surface mount type piezoelectric vibrator manufacturing method can be provided that makes it possible to simultaneously testing more of the surface mount type piezoelectric vibrators with electrical contact terminals in contact with a plurality of surface mount type piezoelectric vibrators arranged with high density without repeated electrical contact terminal contacts, and without any influence on the frequency of adjacent vibrators, and allocate resulting saved time to measurements for performance characteristic measurement items for measurement accuracy guarantee, thus allowing reliability and quality improvements.

a resin mold construction and a method for manufacturing the same can be provided, each of which makes it possible to bring an electrical contact terminal into contact with electrode terminals of a plurality of surface mount type piezoelectric vibrators and to simultaneously measure and test more of a plurality of surface mount type piezoelectric vibrators all together quickly for low costs without resin chipping in the lead terminal portion cutting process, which results from the resin molding process, without complicating resin molding molds with higher cavity density.

DESCRIPTION OF THE PREFERRED EMBODIMENTS

The embodiments of the present invention will be described below with reference with the drawings.

First Embodiments

Figure 1:
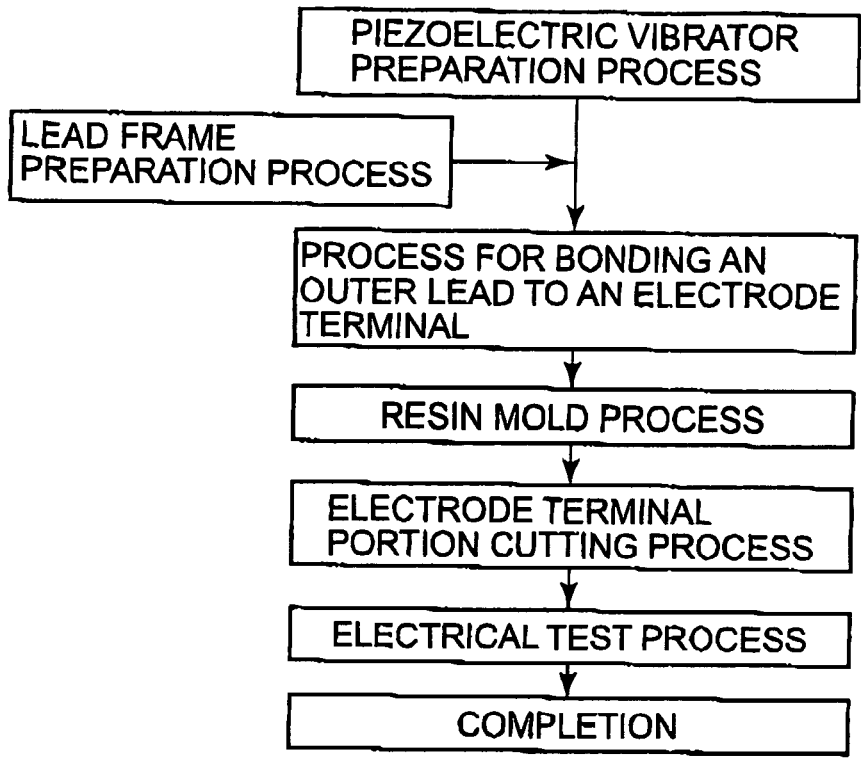
FIG. 1 is a flow chart showing a surface mount type piezoelectric vibrator manufacturing process according to a first embodiment of the present invention.

FIG. 1 is a flow chart briefly showing a surface mount type piezoelectric vibrator manufacturing method according to a first embodiment of the present invention. For the understanding of the embodiment, the following processes will be described below:

1. Piezoelectric vibrator preparation process:

Quartz crystal pieces are formed of piezoelectric material through cutting and polishing. An electrode film required for each quartz crystal piece to operate as an piezoelectric vibrator is formed on each of the front and back surfaces thereof to form a piezoelectric vibrating piece. The piezoelectric vibrating piece is bonded to each airtight terminal attached to a carriage pallet for piezoelectric vibrators. A carriage pallet is prepared for completed piezoelectric vibrators each sealed in a sealing tube.

2. Lead Frame Preparation Process:

A lead frame with electrode terminals formed is prepared, which are to be bonded to outer leads of piezoelectric vibrators.

3. Process for Bonding an Outer Lead to an Electrode Terminal:

The outer lead of each piezoelectric vibrator is bonded to the lead frame with electrode terminals formed.

4. Resin Molding Process:

Each of the piezoelectric vibrators on the lead frame is molded out of resin using predetermined material to form a surface mount type piezoelectric vibrator 5. Electrode Terminal Portion Cutting Process:

Each electrode terminal portion is inserted into a notch groove and soldering is performed on the electrode. Each electrode terminal portion is then cut off from the lead frame with dummy terminals left on the lead frame.

6. Electrical Test Process:

An electrical contact terminal is brought into contact with each of the surface mount type piezoelectric vibrators on the lead frame, which are electrically independent of the lead frame for an electrical test.

Each of the surface mount type piezoelectric vibrators are completed as a product through these processes.

The surface mount type piezoelectric vibrator manufacturing method will be described in further detail in terms of each of the above-mentioned processes.

[Piezoelectric Vibrator Preparation Process]

Figure 2:
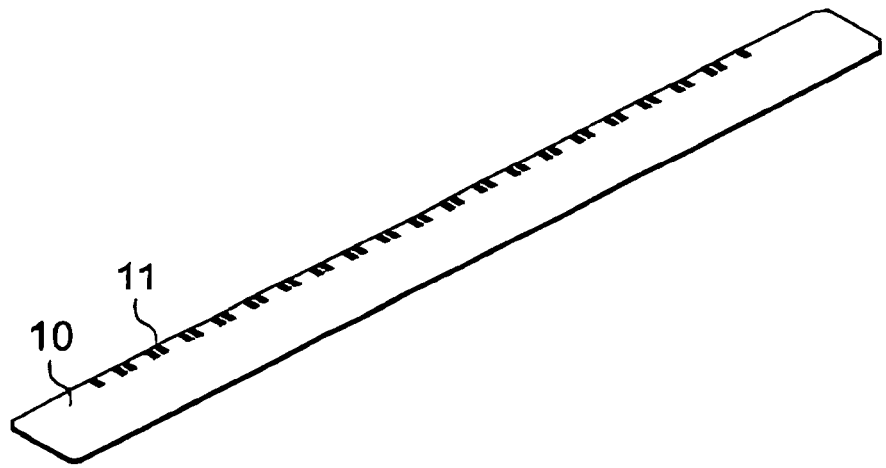
FIG. 2 is a schematic perspective view for describing a carriage pallet for a surface mount type piezoelectric vibrator according to the first embodiment of the invention.
Figure 3:
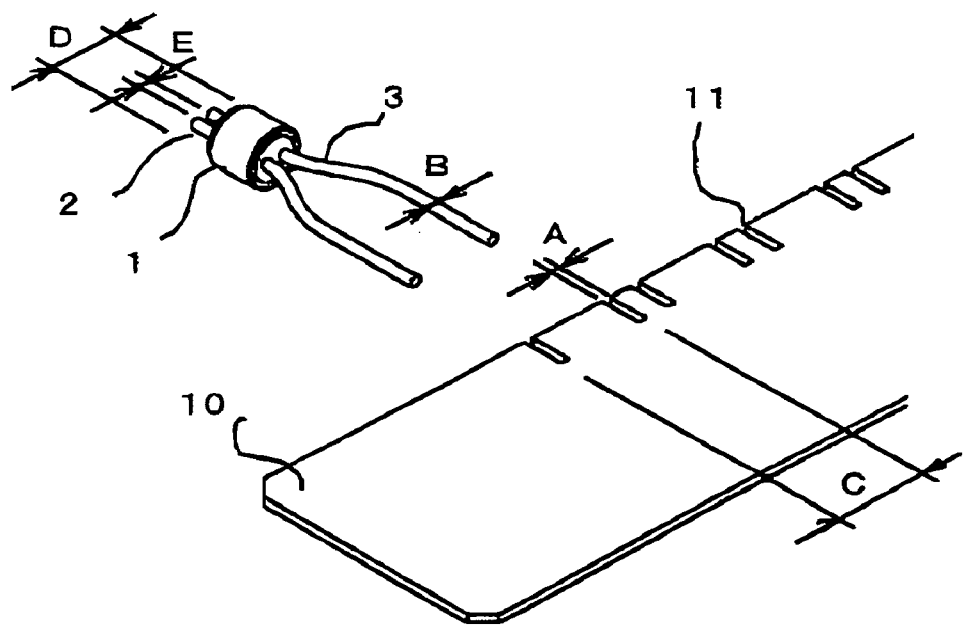
FIG. 3 is a schematic perspective view for describing in detail the carriage pallet for a piezoelectric vibrator of FIG. 2.
Figure 4:
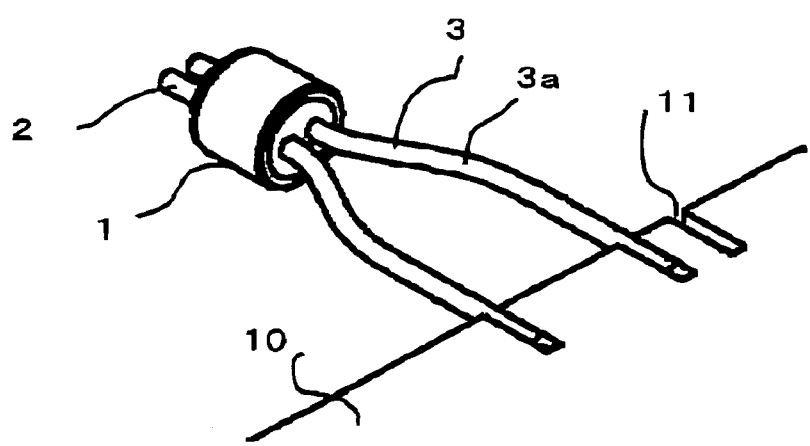
FIG. 4 is a schematic enlarged perspective view of an airtight terminal held on a rectangular thin plate of the carriage pallet according to the first embodiment.
Figure 5:
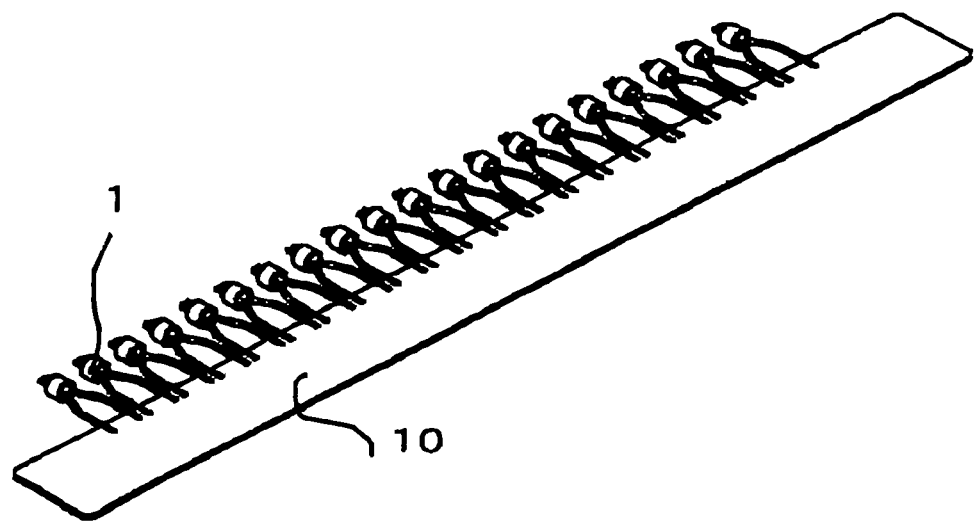
FIG. 5 is a schematic general perspective view of airtight terminals held on the carriage pallet according to the first embodiment.

FIGS. 2 to 5 show schematic perspective views for describing an example of a carriage pallet for a piezoelectric vibrator, used for mounting airtight terminals, according to the embodiment FIG. 2 is a schematic perspective view showing the entire carriage pallet. FIG. 3 is a partial enlarged perspective view for describing in detail the carriage pallet of FIG. 2. FIG. 4 is a partial enlarged perspective view showing the state of the airtight terminal held on a rectangular thin plate of the carriage pallet. FIG. 5 is a schematic perspective view showing the state of the entire airtight terminals held on the carriage pallet.

Figure 6:
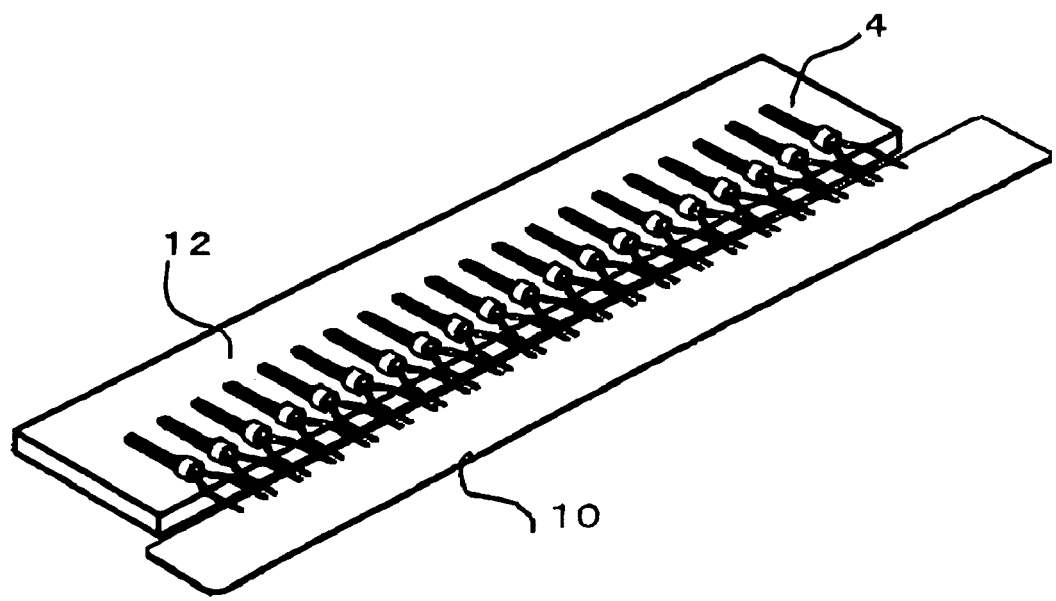
FIG. 6 is a schematic perspective view for describing the alignment of a piezoelectric vibrating piece arrangement jig and the carriage pallet.
Figure 7:
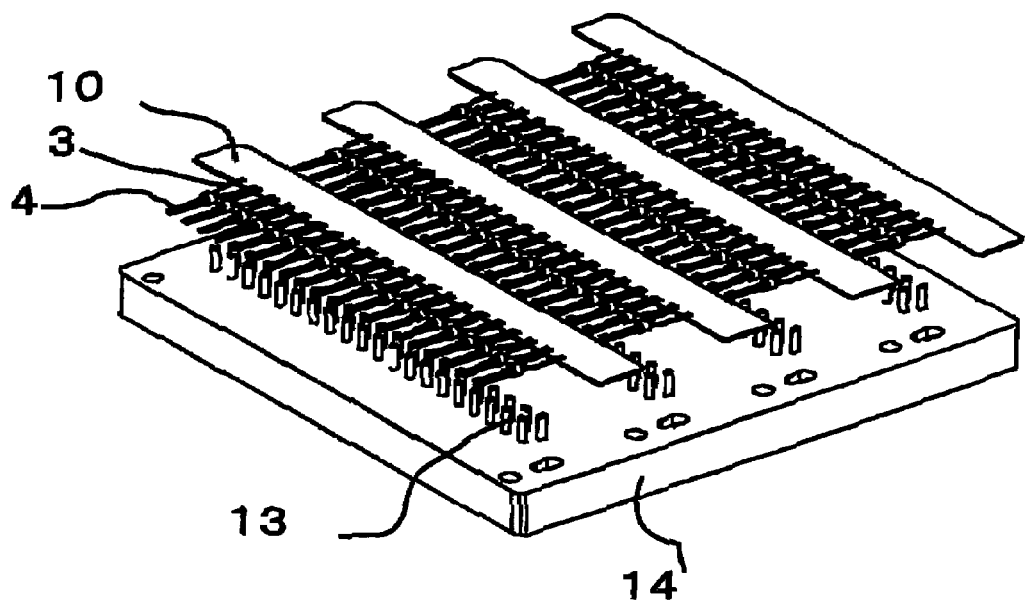
FIG. 7 is a schematic perspective view of an implement for showing electrical measurement according to the first embodiment.
Figure 8:
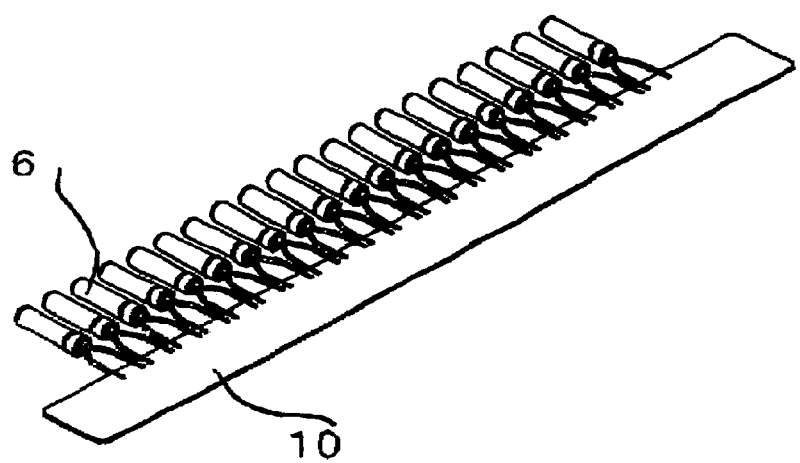
FIG. 8 is a schematic general perspective view of the piezoelectric vibrators held on the carriage pallet according to the first embodiment.

FIG. 6 is also a schematic perspective view for describing the alignment of a piezoelectric vibrating piece arrangement jig and a carriage pallet. FIG. 7 is a schematic perspective view of an implement for describing electrical measurement according to the embodiment. FIG. 8 is a schematic general perspective view of the entire group of piezoelectric vibrators held on the carriage pallet according to the invention.

In the piezoelectric vibrator manufacturing process, the carriage pallet for piezoelectric vibrators with outer leads 3 of airtight terminals 1 attached thereto is used as airtight terminal 1 alignment and carriage means.

As shown in FIG. 2, a carriage pallet 10 for piezoelectric vibrators according to the invention is shaped like a rectangular thin plate and has a plurality of cuts 11 along a long side thereof. As shown in FIG. 3, pairs of at least 2 cuts are arranged. The width A of the cut 11 is generally equal to the diameter B of an outer lead 3. The cut 11 interval C is larger than the outer diameter D of the airtight terminal 1.

A plurality of cuts 11 are formed along one side of the carriage pallet 10 using a general-purpose precision processing machine such as a dicing machine which provides a processing accuracy of a few μm, for example. Each pair of outer leads 3 are inserted into cuts for holding purposes, thereby making highly accurate the shape of the carriage pallet 10 required for the processes according to the invention, and the positions of a plurality of cuts 11 and outer leads 3.

As shown in FIG. 4, each outer lead 3 has a width slight smaller than the width of each of the plurality of cut 11 intervals and inserted into the cut and held by a method such as press-fitting or adhesion.

In the present embodiment, the shape accuracy of the carriage pallet 10, the width accuracy for the cut 11 and the accumulated pitch accuracy for cuts 11 are within 5 μm. The width A of the cut 11 shown in FIG. 3 is generally equal to the diameter B of the outer lead 3. The former width is 0.16 mm and the latter is 0.18 mm. The interval C for a pair of cuts 11 is 1.5 mm. The outer diameter D of the airtight terminal 1 is 1.1 mm. The gap E between inner leads 2 is 0.3 mm. The interval C for a pair of cuts 11 is larger than the outer diameter D of the airtight terminal 1 and 5 times as large as the 0.3 mm gap E between inner leads 2. This cause the accuracy of a turning angle for inner leads 2 to be controlled to ⅕ of a turning angle for outer leads 3.

This ensures that the positions of the outer leads 3 of the airtight terminal 1 and the inner leads 2 are very accurate in the carriage pallet 10. The accuracy is at a high level of accuracy provided by the precision processing machine.

The carriage pallet 10 is formed of ceramic material, which can maintain the positional accuracy of a plurality of cuts 11 and electrical isolation between the plurality of cuts 11, thus making inner leads 2 according to the embodiment electrically independent. The material is preferable for the measurement process for obtaining a predetermined frequency by applying drive voltage of a piezoelectric vibrating piece 4.

As shown in FIG. 5, the carriage pallet 10 can easily carry and move individual airtight terminals 1 attached thereto all together at one time. The simple shape of the rectangular thin plate can also facilitate the removal of the carriage pallet 10. The carriage pallet 10 is easy to position and easy to stabilize and suitable for the automation of the bonding process according to the embodiment. The carriage pallet 10 is also wear resistant enough to withstand repeated alignment work and transfer between manufacturing units. The carriage pallet 10 can be used during heating and in a vacuum. The carriage pallet 10 is also preferable for a plurality of processes in the manufacture of piezoelectric vibrators for carriage pallet 10 for piezoelectric vibrators.

As shown in FIG. 4, the outer lead 3 has the central portion 3a thereof directed outward. The outer lead 3 is formed to have the width 11 of the cut interval and inserted into a cut. A turning angle for the outer lead and a high positional accuracy of a plurality of grooves in the pallet allows the outer lead to be formed to have a required bend. This makes accurate the position of the central portion required for bonding.

As described above, inner leads 2 inside airtight terminals 1 are attached to the carriage pallet 10 shown in FIG. 5 for piezoelectric vibrators with high accuracy. As shown in FIG. 6, the carriage pallet 10 with inner leads 2 attached accurately thereto is aligned with an arrangement jig 12 with piezoelectric vibrating piece 4 arranged thereon. The inner lead 2 is brought into contact with the piezoelectric vibrating piece 4. After heating, the piezoelectric vibrating piece 4 is bonded to the inner lead 2.

In the frequency trimming process for obtaining the abovementioned predetermined frequency, the carriage pallet 10 for piezoelectric vibrators with outer leads 3 attached thereto is passed through a heated furnace. As shown in FIG. 7, the carriage pallet 10 is then laid on a measurement block 14 measurement terminals 13 provided thereon in a vacuum and the measurement blocks 14 are brought into contact with the outer leads 3 of the airtight terminal of the piezoelectric vibrator. Drive voltage is applied to piezoelectric vibrating pieces 4 to repeatedly obtain the predetermined frequency for frequency trimming. A sealing tube 5 is capped to each of the airtight terminals 1 by press-fitting. Outer diameter of the sealing tube 5 is 1.2 mm. As a result, the piezoelectric vibrating piece 4 is airtight sealed to form a vacuum inside. As shown in FIG. 8, this provides completed piezoelectric vibrators 6 attached to the carriage pallet 10 in the piezoelectric vibrator preparation process.

[Lead Frame Preparation Process]

Figure 12:
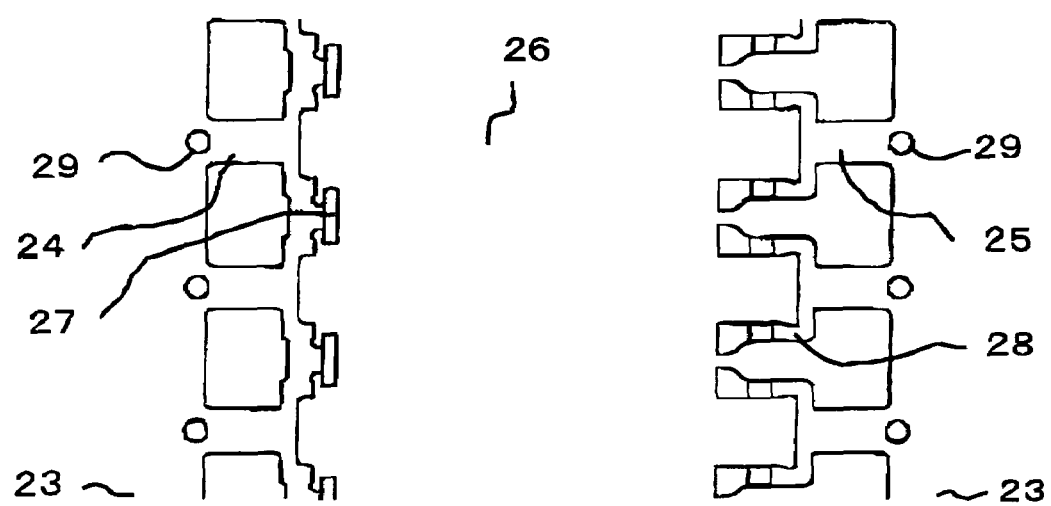
FIG. 12 is an enlarged plan view of part B of the lead frame of FIG. 10.
Figure 13:
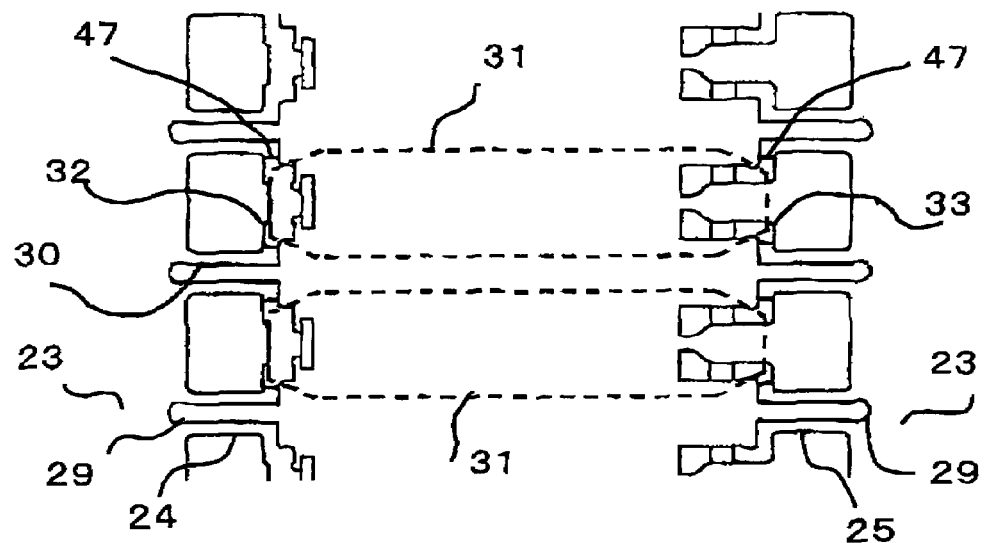
FIG. 13 is an enlarged plan view of part B for describing the lead frame of FIG. 10.
Figure 14:
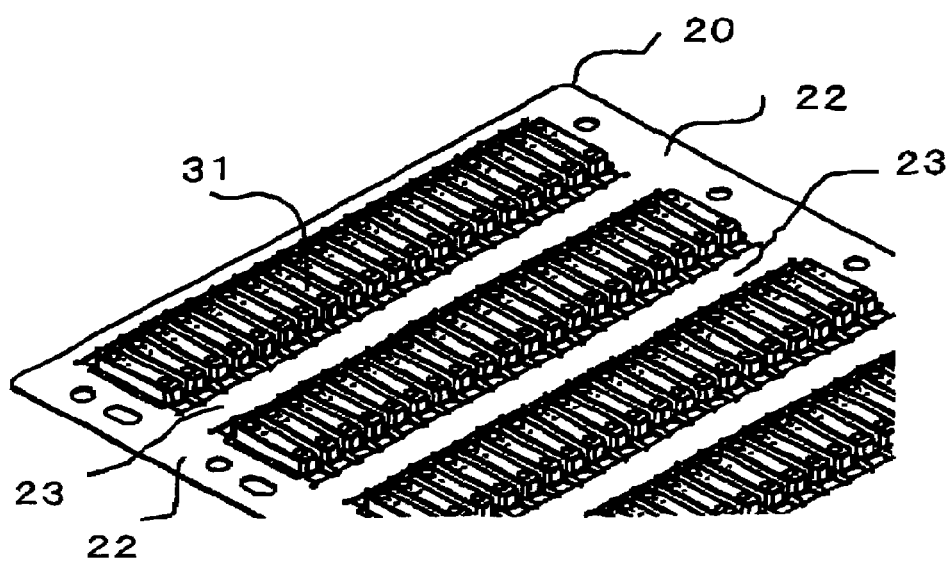
FIG. 14 is a schematic perspective view showing a state where the surface mount type piezoelectric vibrators according to the first embodiment are molded out of resin on the lead frame.
Figure 15:
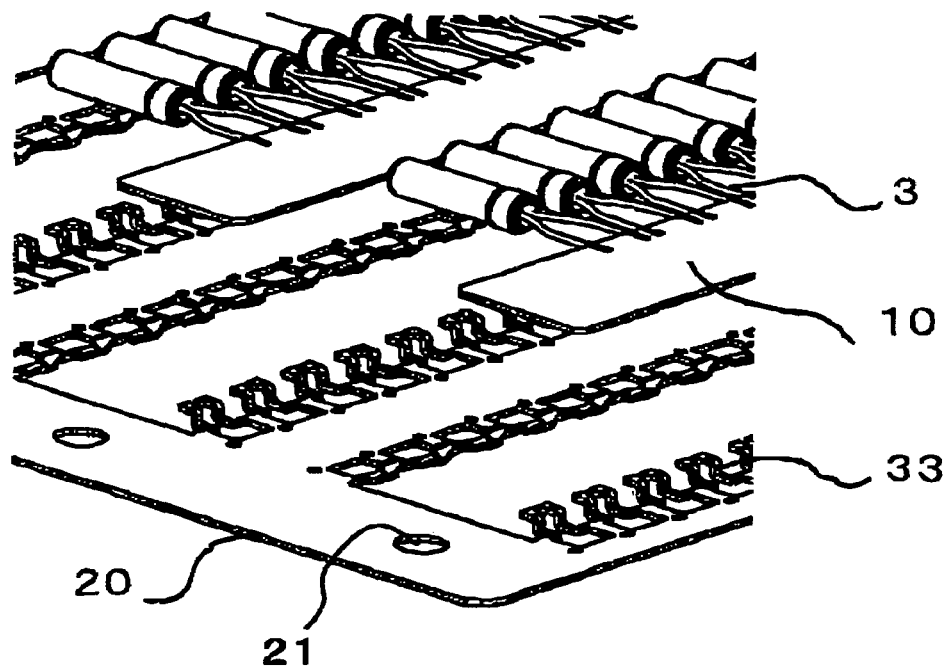
FIG. 15 is a schematic perspective view for describing a process for bonding an outer lead to a lead frame.
Figure 16:
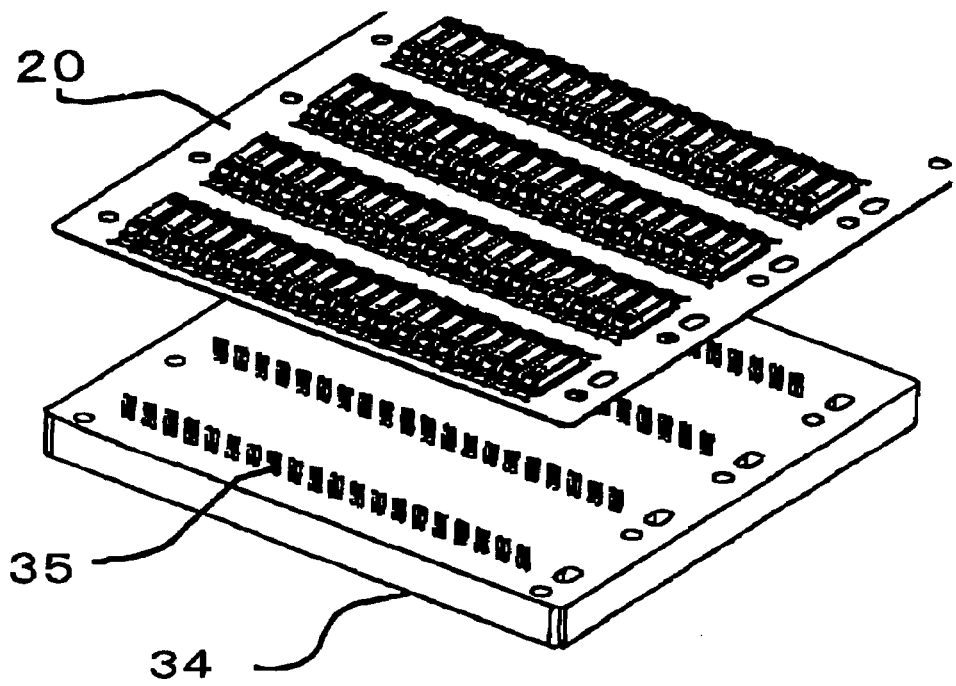
FIG. 16 is a schematic perspective view of an implement for describing the electrical test according to the first embodiment.

FIGS. 9 to 13 are schematic perspective views of a lead frame for surface mount type piezoelectric vibrators according to the embodiment. The lead frame has electrode terminals and dummy terminals formed thereon, which outer leads 3 for piezoelectric vibrators 6 are to be bonded to and schematic views for describing the lead frame. FIG. 14 is a schematic perspective view of the lead frame with surface mount type piezoelectric vibrators according to the embodiment molded out of resin. FIG. 15 is a schematic perspective view for describing a process for bonding outer leads to a lead frame. FIG. 16 is a schematic perspective view of an implement for describing an electrical test according to the embodiment.

A lead frame, an important component, is deeply associated with each of the process for boding an outer lead to an electrode terminal, the resin molding process, the electrode terminal portion cutting process and the electrical test process, each of which will be described later. Lead frame preparation will be described below in detail.

Figure 9:
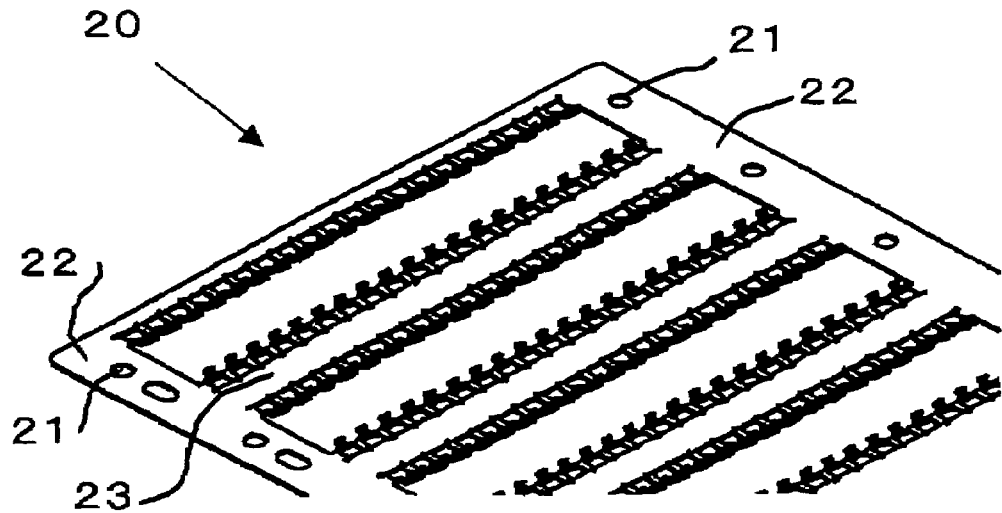
FIG. 9 is a schematic perspective view of a lead frame for a surface mount type piezoelectric vibrator according to the first embodiment.

FIG. 9 is a schematic perspective view of a lead frame 20 for surface mount type piezoelectric vibrators according to the invention.

In FIG. 9, a reference numeral 22 depicts a side frame. A pair of side frames 22 are disposed across the lead frame 20. A positioning hole 21 is used for carrying and positioning the lead frame 20. The lead frame 20 has one or more positioning holes 21 in the longitudinal direction of the lead frame 20. There are section bars 23 between the pair of side frame 22. The side frame 22 bridge between the pair of side frames 22 and constitute the framework of the lead frame 20. The positioning hole 21 is provided between each of the pairs of section bars 23.

Figure 10:
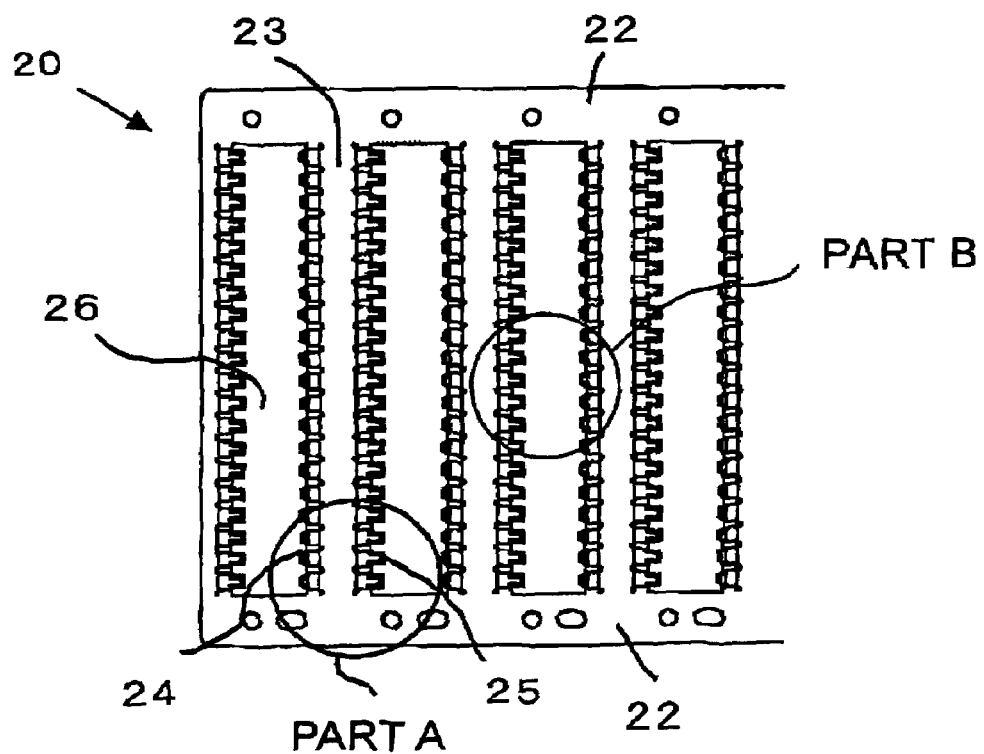
FIG. 10 is a schematic plan view for describing the lead frame of FIG. 9.

FIG. 10 is a plan view of the lead frame of FIG. 9. In FIG. 10, a frame area 26 is an area partitioned by a pair of side frames 22 and a section bar 23 bridging between the pair of side frames 22. There are a plurality of first lead sections 24 arranged at predetermined intervals in the frame area 26 partitioned by the side frame 22 and section bar 23. The first lead section 24 extends from the section bar 23. Each of the intervals at which first lead section 24 are arranged is slight larger than the outside width of a surface mount type piezoelectric vibrator 31, which will be described later. In the same frame area 26, a plurality of second lead section 25 are arranged at the same intervals as the plurality of first lead sections 24. The second lead section 25 faces the first lead section 24 and extends from the section bar 23. Both the plurality of first lead sections 24 and the plurality of second lead sections 25 are arranged across the lead frame 20. The plurality of first lead sections 24 and the plurality of second lead sections 25 face one another in the longitudinal direction of the lead frame 20.

The lead frame 20 according to the embodiment is formed by forming a side frame 22, first and second lead sections 24, 25 of a flat material 0.15 mm in thickness, for example, through press work and performing predetermined bending work on each of these components. The flat material is made of conductive material such as iron-containing alloy such as 42 alloy.

In the frame area 26 partitioned by the side frame 22 and section bar 23, only the first and second lead sections 24, 25 are disposed as shown in FIG. 10, with no frames for individual lead sections. The frame area 26 serves as an area occupying a large area and it is possible to make the most of the space inside the frame area 26.

Figure 11:
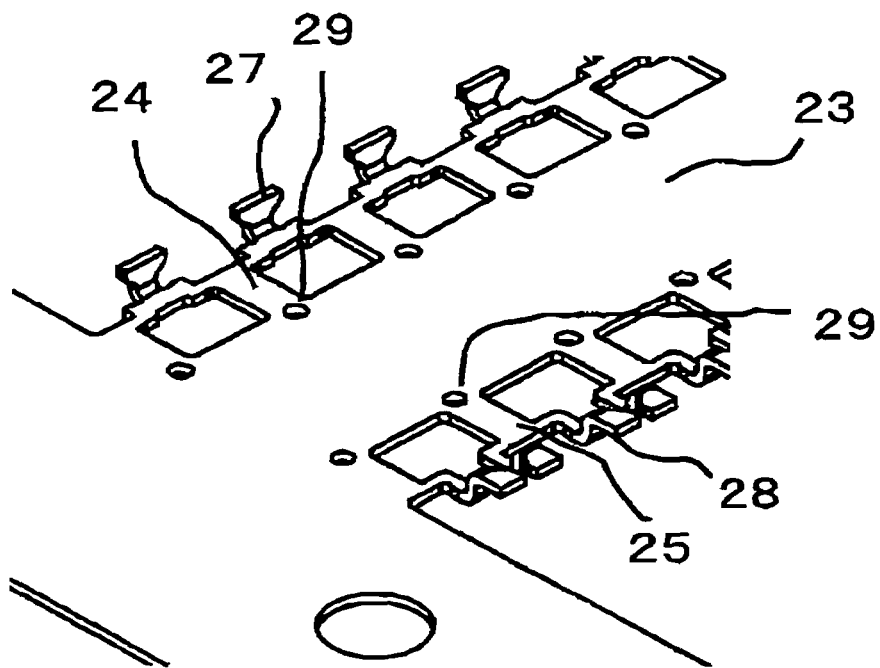
FIG. 11 is an enlarged perspective view of part A of the lead frame of FIG. 10.

FIG. 11 is an enlarged perspective view of part A of FIG. 10. In FIG. 11, a plurality of first lead sections 24 extending from the section bar 23 have adjacent tips connected to each other. There is a first protruding portion 27 formed at the central portion of the resultant tip connection. The first protruding portion 27 has a vertical portion further formed. The tip of the first lead section 24 and the first protruding portion 27 at the central portion of the tip connection undergo subsequent manufacturing processes and serve as dummy terminals for a surface mount type piezoelectric vibrator, which will be described later.

Each of the plurality of second lead sections 25 extending from the section bar 23 has a second protruding portion 28 formed to face the first protruding portion 27. Unlike the plurality of first lead section 24, each of the plurality of second lead sections 25 has adjacent second protruding portions 28 formed independently. The second protruding portion 28 has a vertical portion and a horizontal portion further formed and bent like a crank. The adjacent second protruding portion 28 independently formed undergo subsequent manufacturing processes and serve as electrode terminals 33 for a surface mount type piezoelectric vibrator 31, which will be described later.

The lead frame 20 according to the embodiment will be described below with reference with FIG. 12. FIG. 12 is an enlarged plan view of part B in the lead frame 20 shown in FIG. 10.

As shown in FIG. 12, first lead section 24 faces the second lead section 25 in the longitudinal direction of the lead frame 20 with frame area 26 between these lead sections. A plurality of through holes 29 are formed to correspond to each of the first lead section 24 and second lead section 25 on a center line connecting the centers of the first lead section 24 and the second lead section 25. The through hole 29 is provided in the longitudinal direction of the lead frame 20. The through hole 29 is also provided where section bar 23 intersects with the first lead section 24 and where the section bar 23 intersects with the second lead section 25.

The plurality of through holes 29 are provided as described above in advance because a slit having a width at least smaller the diameter of the through hole 29 is cut with the hole 29 as the end point in the subsequent electrode terminal portion cutting process.

If a slit with a closed end is cut, a cutting tool on the closed end is subjected to a local load, which affects the service life of the cutting tool and makes a continued slit cutting work difficult. Therefore, a through hole 29 is provided if a slit is cut between the central portion of the tip of the first lead section 24 in the lead frame 20. This makes it possible to continue cutting the slit with no local load on the cutting tool. The slit cutting work will be again described later when describing the subsequent electrode terminal portion cutting process.

As a result, a surface mount type piezoelectric vibrator 31 characteristically has a width that is ⅓ to ⅕ smaller than the length thereof. As shown in FIG. 14, surface mount type piezoelectric vibrators 31 are directed in the longitudinal direction of the lead frame 20 and arranged across the width of the lead frame 20. Therefore, surface mount type piezoelectric vibrators 31 can be disposed with high density in a matrix on the lead frame 20.

In the process for bonding an electrode terminal 33 to an outer lead 3 on the lead frame 20 for a surface mount type piezoelectric vibrator according to the embodiment, outer leads 3 are arranged in the same position as electrode terminals 33 on the lead frame 20, as shown in FIG. 15 and as will be described later. Therefore, a plurality of outer leads 3 are simultaneously aligned with high density through a single alignment of a carriage pallet 10 as a carriage pallet. The outer leads 3 are laid on the bonding electrode terminals 33 and transferred for bonding purposes. Therefore, outer leads 3 can be simultaneously bonded to electrode terminals 33 with high accuracy and in a stable manner on the lead frame 20.

In the resin molding process for the lead frame 20 for surface mount type piezoelectric vibrators according to the embodiment, cavities are connected to one another through a flat surface, as shown in FIG. 14 and as will be described later. Therefore, adjacent cavities are directed in the longitudinal direction of the side frame 22 and first and second lead sections 24, 25 are directed in the direction of the side frame 22. Surface mount type piezoelectric vibrators are thus arranged with good space efficiency. One runner is disposed on the section bar 23 and includes injection molding ports provided toward between the first lead section and the second lead section. Thus, a line having a minimum length is provided per cavity and cavities ad provided with a maximum density on the section bar 23 having a minimum configuration with no wasteful frames. Molds having a construction that provides a maximum resin use rate are also provided on the lead frame 20.

The longitudinal directions of the first and second lead sections 24, 25 and cavities are in the direction of the side frame 22 and piezoelectric vibrators are arranged in the direction of he section bar 23. This permits mold center misalignment to appear in the misalignment-insensitive longitudinal direction of the surface mount type piezoelectric vibrator, while mold center misalignment conventionally appears in the longitudinal direction of the side frame 22. Therefore, a resin mold construction can be provided that can eliminate resin chipping due to the center misalignment for the surface mount type piezoelectric vibrator in the process for cutting the first and second lead sections on the lead frame 20.

The lead frame 20 for surface mount type piezoelectric vibrators according to the embodiment suffers from no warpage across the lead frame 20 through a slit 30 provided with a through hole 29 as an end point in the electrode terminal 33 portion cutting process, which will be described later. This is because the expansion of a surface with a slit cut therein is absorbed the slit 30.

In the electrical test process for the lead frame 20 for surface mount type piezoelectric vibrators according to the embodiment, as will be described later with reference to FIG. 16, each of the surface mount type piezoelectric vibrator has two-directional terminals: one terminal functions as an electrode terminal 33 and the other is an electrically completely independent dummy terminal 32. The surface mount type piezoelectric vibrators can be arranged on the section bar 23 having a minimum configuration with no wasteful frame, in a matrix with high density over the entire lead frame 20. The largest possible number of electrical contact terminals 35 on an electrical test measurement block are brought into contact with the piezoelectric vibrators on the lead frame 20.

As described above, by the method described above, the lead frame 20 for surface mount type piezoelectric vibrators makes it possible to meet a positional accuracy required for alignment in the process for bonding an outer lead 3 to an electrode terminal 33, eliminate resin chipping in the resin molding process, maintain mold accuracy with a higher cavity density without complicating resin molding molds, eliminate lead frame deformation in the cutting process and measure surface mount type piezoelectric vibrators on the lead frame in an electrical test in the electrical test process.

[Process for Bonding the Outer Lead and the Electrode Terminal]

Figure 17:
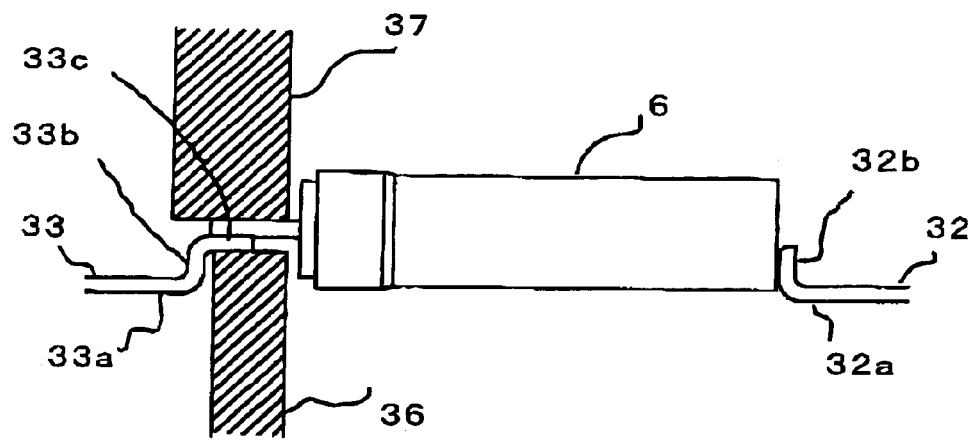
FIG. 17 is a schematic cross sectional view for describing the bonding process according to the first embodiment.
Figure 18:
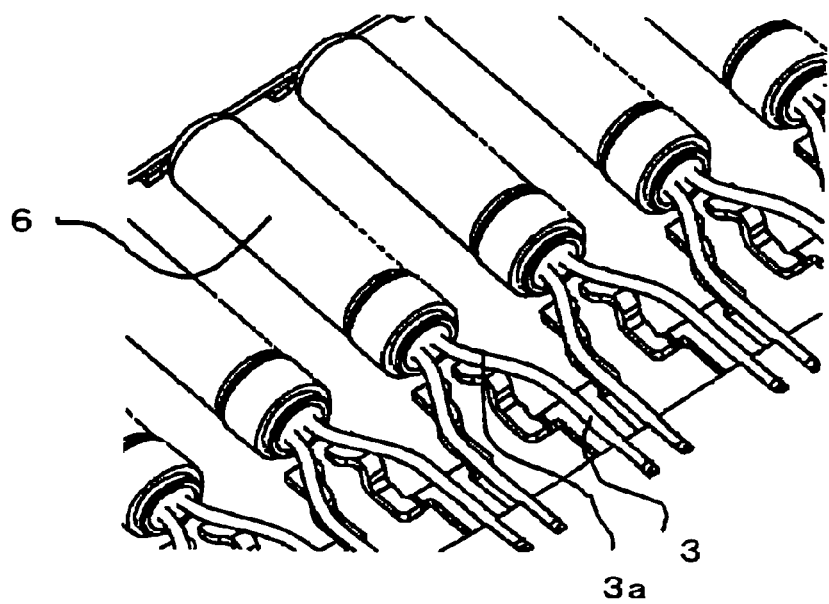
FIG. 18 is a schematic cross sectional view for describing the bonding process according to the first embodiment.
Figure 19:
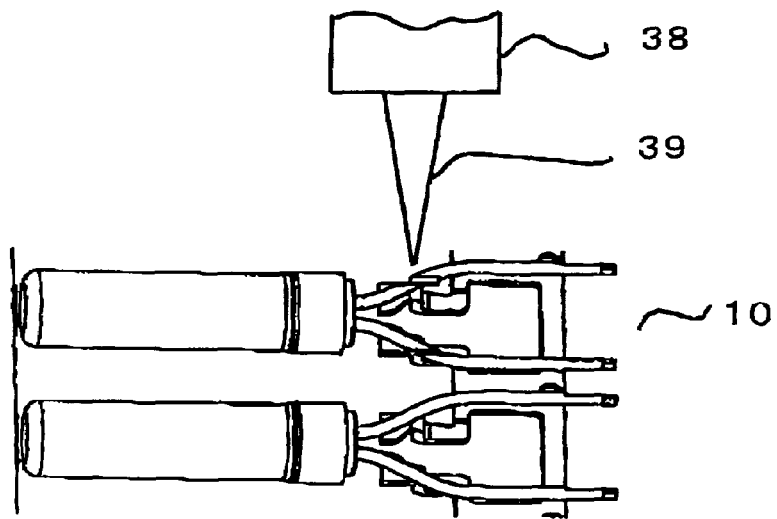
FIG. 19 is a schematic perspective view for describing a process for separating an outer lead from a pallet according to the first embodiment.
Figure 20:
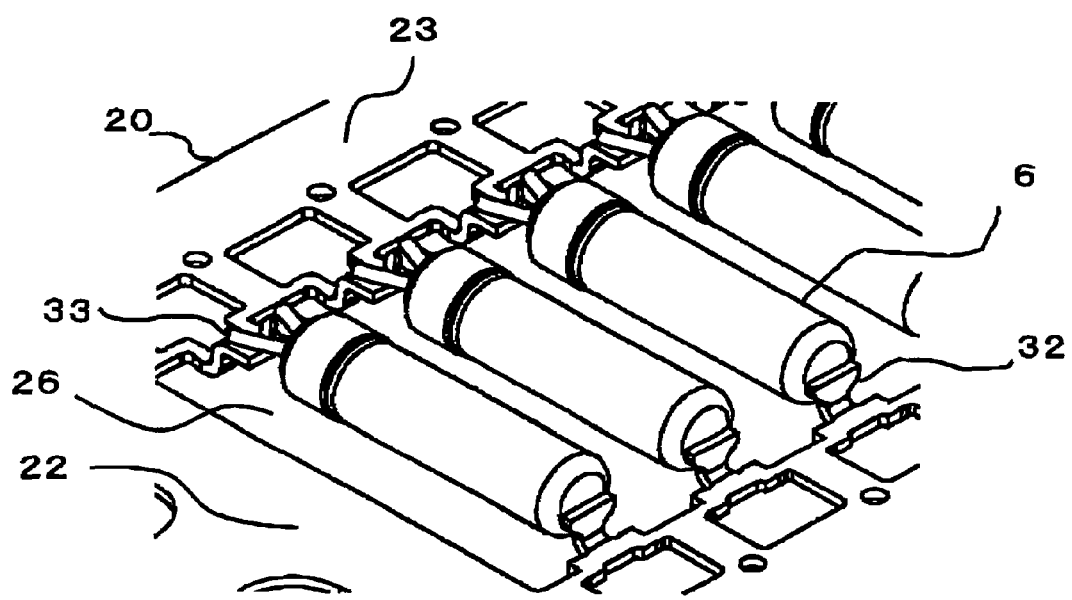
FIG. 20 is a schematic perspective view for describing a completed shape in the bonding process according to the first embodiment.

FIG. 15 is a general schematic perspective view for describing a bonding process according to the embodiment. FIGS. 17 and 18 are a schematic cross sectional view and a perspective view for describing the process for bonding the outer lead 3 and the lead frame 20, shown in FIG. 15. FIG. 19 is schematic perspective view for describing a process for separating an outer lead 3 from a pallet 10 according to the first embodiment. FIG. 20 is a schematic perspective view for describing a completed shape in the bonding process according to the first embodiment.

As described in the lead frame preparation process, when the configuration of the lead frame 20 is summarized, a plurality of first lead sections 24 and a plurality of second lead sections 25 are provided in the frame area 26 shown in FIG. 12. The first lead sections 24 extend from the section bar 23 at appropriate intervals. The second lead sections 25 faces first lead sections and extend at same intervals. The first lead section 24 has adjacent lead sections connected to forma a first protruding portion 27 at the central portion. The second lead section 25 has a tip divided into two portions to form a second protruding portion 28. The first protruding portion 27 has a vertical portion formed, which portion serves as a dummy terminal 32 for a surface mount type piezoelectric vibrator 31 after slit 30 cutting, as shown in FIG. 13 and as will be described later. The second protruding portion 28 at the tip of the second lead section 25, divided into two portions, is bent like a crank having a vertical portion and a horizontal portion. The second protruding portion 28 undergoes subsequent manufacturing processes and serves as an electrode terminal 33 for a surface mount type piezoelectric vibrator 31. The section bar 23 has a margin in width relative to the rectangular thin plate used as a carriage pallet 10 and as an application for disposing a runner used in resin molding. As compared with a conventional lead frame, the lead frame 20 has relatively a high strength and a high rigidity until a slit described later is cut. The shape and positional accuracy for the dummy terminal 32 and the electrode terminal 33 is maintained.

As shown in FIG. 17, a dummy terminal 32 has a portion 32a extending horizontally and a portion 32b extending vertically from the portion 32a. An electrode terminal 33 facing the dummy terminal 32 has a portion 33a extending horizontally from the section bar 23 of a lead frame 20, a portion 33b extending vertically from the portion 33a extending horizontally, and a portion 33c extending horizontally from the upper end of the portion 33b extending vertically. The portions 33a and 32a extending horizontally are configured as lower electrode terminals 33a, 32a, which is to be connected to an external electrode on a mounted substrate after resin molding.

In the bonding process, piezoelectric vibrators 6 are disposed in a frame area 26, which is a space for surface mount type piezoelectric vibrator 31 arrangement on a lead frame 20. The piezoelectric vibrators 6 are properly aligned and outer leads 3 are placed on the upper terminals 33c on the lead frame 20. The outer leads 3 and the upper electrode terminals 33c are then received by lower bonding electrodes 36. The outer lead 3 and the upper electrode terminal 33c are held between the upper electrode 37 and the lower electrode 36 and voltage is applied for bonding purposes.

As shown in FIG. 15, a plurality of positioning holes 21 are provided at constant intervals on a side frame 22 on a lead frame 20. Lead frame 20 positioning pins (not shown) are provided to rise at constant intervals on a lead frame 20 positioning jig. The pins correspond to a plurality of positioning holes 21 on the lead frame 20. The lead frame 20 is aligned with the side frame 22 by inserting the positioning pins into the plurality of positioning holes 21 in the lead frame 20.

Piezoelectric vibrators 6 are then disposed in a frame area 26 for surface mount type piezoelectric vibrator 31 arrangement on the lead frame 20.

For understanding, in a method for moving conventional piezoelectric vibrators 6 individually, it is difficult to align a turning angle for the outer lead 3, a bonding point 3a for electrical continuity with an outer lead 3 and the position of a cutting end for the outer lead 3. Therefore, the correct alignment of the three points is required.

In other words, conventionally there is an inconvenience where three alignments cannot made properly and bonding cannot be performed. These three alignments include a turning angle difference for a pair of two outer leads 3 relative to a pair of two upper electrode terminals 33c, an alignment of required bonding points 3a between the central portion of the upper electrode terminal 33c, the bonding point of the upper electrode terminal 33c, and the bent outer lead 3 and a alignment of the end of the outer lead 3 between the upper electrode terminal 33c and the contour of the piezoelectric vibrator 6.

In the embodiment, the outer lead 3 is aligned with the lead frame 20 by a method for using a carriage pallet 10 that ensures the turning angle for the outer lead 3 for the piezoelectric vibrator 6 and positional accuracy as alignment means.

As shown in FIG. 15, an alignment reference for the carriage pallet 10 is provided on a lead frame 20 positioning jig to settle the positions of the carriage pallet 10 and the lead frame 20. The alignment reference for the carriage pallet 10 is the same as positioning pins (not shown) on the lead frame 20. The reference on the carriage pallet 10 is aligned with the same reference on the lead frame 20 by bringing the carriage pallet 10 into contact with the positioning reference on the carriage pallet 10.

The carriage pallet 10 with outer leads 3 inserted thereinto for holding purposes meets the shape accuracy and positioning accuracy of the carriage pallet 10 required for proper alignment, as described in the aforementioned piezoelectric vibrator preparation process. In other words, 1. The shape accuracy of the carriage pallet 10 is the same as a level of accuracy obtained by the precision processing machine described earlier, thus ensuring the positional accuracy of the outer lead 3 for the airtight terminal 1.

2. The gap E of the inner leads 2 protruding from the airtight terminal 1 shown in FIG. 3 is smaller than the outer diameter D of the airtight terminal 1 for the piezoelectric vibrator 6. As compared with this, the cut 11 interval C disposed to hold the outer lead 3 is larger than the outer diameter D of the airtight terminal 1 as described earlier. Therefore, the turning angle for the outer lead 3 and the position of the central bonding point 3a are regulated.

3. The lead frame 20 brought into contact with the outer leads 3 has a higher rigidity against deformation and is highly accurate. The alignment accuracy is therefore obtained by inserting positioning guide pins and the like into a plurality of positioning holes 21 to position the lead frame 20. In the process for bonding an outer lead 3 to an electrode terminal 33, the requirements for stable bonding between the outer lead 3 and the electrode terminal 33 are met.

4. In addition, dummy terminals 32 and electrode terminals 33 are arranged in the same direction as piezoelectric vibrators 6. It is therefore easy to align the carriage pallet 10 with the lead frame 20 and the carriage pallet 10 is preferable for machine processing using a transfer tool and the like.

As described above, the carriage pallet 10 can be utilized for three alignments including the turning angle for the outer lead 3, the central point 3a of the outer lead 3 such as a bonding point for electrical continuity with outer lead 3, and the end cutting terminal point for the outer lead 3.

Means for properly aligning the outer lead 3 and the piezoelectric vibrator 6 with the lead frame 20 can be taken without requiring means by a conventional method for using a radiused surface corresponding to the cylindrical side of the piezoelectric vibrator. In addition, the terminal of the outer lead 3 can be handled with required positional accuracy, which helps to reduce the longitudinal direction of the surface mount type piezoelectric vibrator 31.

Electrode terminal 33 are arranged on the lead frame 20 in the same manner as outer leads 3 for piezoelectric vibrators 6 are arranged on the carriage pallet 10, as shown in FIG. 15. Therefore, the stable positional accuracy guaranteed by the lead frame 20 and the carriage pallet 10 can be transferred as it is and bonding preparation is made with accuracy and stable posture ensured.

Under the above condition, an lower bonding electrode 36 is brought into contact with the bottom of an upper electrode terminal 33c for forming electrical continuity with an outer lead 3 outside a piezoelectric vibrator 6, as shown in FIGS. 17 and 18. The outer lead 3 is bonded to the upper electrode terminal 33c by pressing a portion between an upper bonding electrode 37 and the lower bonding electrode 36 from above the outer lead 3 and applying voltage to the both of the upper bonding electrode 37 and the lower bonding electrode 36.

As shown in FIG. 19, after the bonding of the outer lead 3 and the electrode terminal 33, a portion between the bonding position of the outer lead 3 and the carriage pallet 10 is irradiate with laser beam 39 using a laser unit 38 for cutting purposes to separate the piezoelectric vibrator 6 from the carriage pallet 10, which has been incorporated into the carriage pallet 10 through the bonding of the lead frame 20 and the carriage pallet 10.

The outer lead 3 for the piezoelectric vibrator 6 is properly aligned with and bonded to the lead frame 20. The cutting position of the outer lead 3 with the lead frame 20 as a reference is then irradiated with laser beam 39 for cutting purposes. As shown in FIG. 20, the piezoelectric vibrator 6 is separated from the carriage pallet 10. The cutting position of the outer lead 3 suffers from no deviation in the longitudinal directional dimension of the piezoelectric vibrator 6 or no deviation in cutting accuracy for the outer lead 3 including the deviation and the terminal of the outer lead 3 is handled with required positional accuracy.

The ability to properly align the piezoelectric vibrator 6 with lead frame 20 also allows sure electrical connection and the proper formation of a resin-molded section around the piezoelectric vibrator 6.

As described above, by the method described above, the turning angle for a pair of two outer leads 3 relative to the upper electrode terminal 33c is regulated by a plurality of cuts 11 in the rectangular thin plate. A required positional accuracy for the outer lead 3 is met and the turning angle for the outer lead 3 and the plurality of cuts 11 in the rectangular thin plate are obtained with high positional accuracy. The outer lead 3 can therefore be bent into a required shape and with the alignment of required bonding points. Electrode terminal 33 are arranged on the lead frame 20 in the same manner as outer leads 3 are arranged on the rectangular thin plate. This allows a positional accuracy to be ensured, which is guaranteed by the lead frame 20 and the rectangular thin plate and stable, thus providing stable bonding. The piezoelectric vibrator 6 can be separate from the carriage pallet 10 by irradiating the piezoelectric vibrator 6 with laser beam 39 for cutting with the lead frame 20 as a reference. Therefore, the terminal of the outer lead 3 can be handed with required positional accuracy.

[Resin Molding Process]

Figure 21:
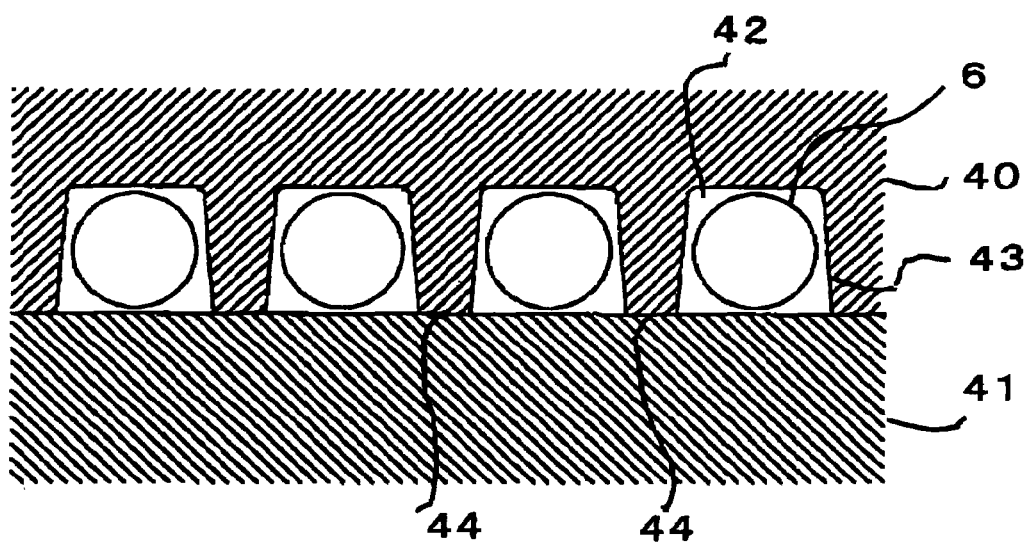
FIG. 21 is a schematic cross sectional view of a resin mold construction for surface mount type piezoelectric vibrators according to the first embodiment.

With piezoelectric vibrators 6 between an upper mold 40 and a lower mold 41 for resin molding, as shown in FIG. 21, these molds are closed and molding material is poured to form a resin-molded section 42. A process for molding piezoelectric vibrators 6 out of resin in a matrix with high density on the lead frame 20, as shown in FIG. 22, will be described below.

FIG. 21 is a schematic cross sectional view showing a resin mold construction for surface mount type piezoelectric vibrators 31 according to the embodiment. FIG. 22 is a schematic perspective view of surface mount type piezoelectric vibrators 31 molded out of resin on the lead frame 20 according to the embodiment. FIG. 23 is a schematic plan view for describing the resin mold construction according to the embodiment.

Figure 22:
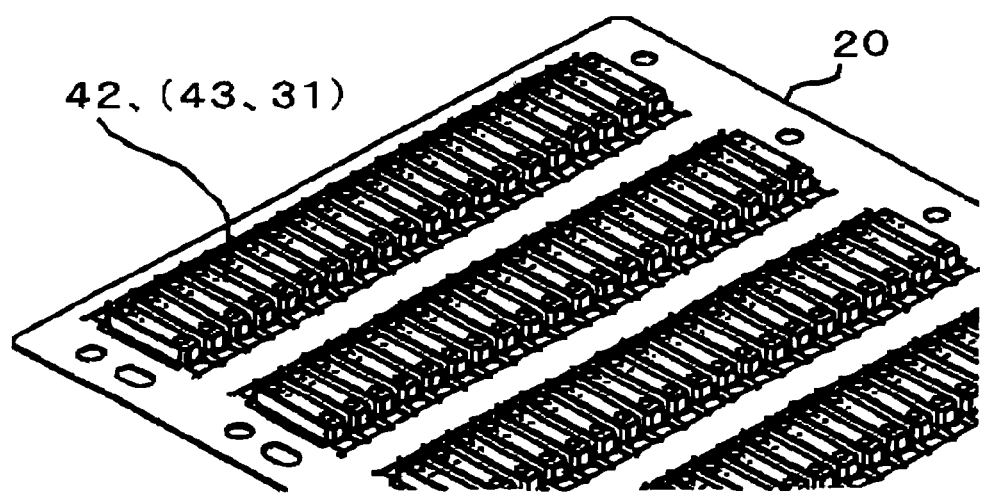
FIG. 22 is a schematic perspective view of surface mount type piezoelectric vibrators molded out of resin on the lead frame according to the first embodiment.
Figure 23:
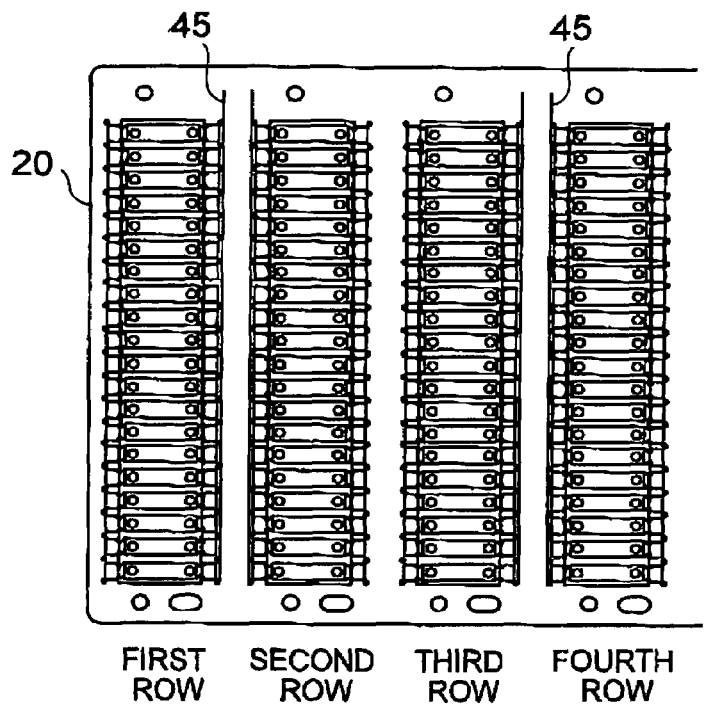
FIG. 23 is a schematic plan view for describing the resin mold construction according to the first embodiment.

In the resin molding process according to the embodiment, the piezoelectric vibrators 6 bonded to the electrode terminals 33 and the dummy terminals 32 on the lead frame 20 shown FIG. 20 are placed between the upper mold 40 and lower mold 41 shown in FIG. 21 and the molds are closed to form resin-molded sections 42 shown in FIG. 22.

In the lead frame 20 used for the resin molding process according to the embodiment, a side frame 22 and a frame area 26 for surface mount type piezoelectric vibrator 31 arrangement partitioned by a section bar 23 have no reinforcement frames and the like, which will correspond to a section bar 62 in a conventional lead frame 60. The resin molding process according to the embodiment can therefore be a resin molding process in which a plurality of surface mount type piezoelectric vibrators 31 are arranged on a single flat surface.

In other words, as shown in FIG. 21, cavities 42 are, for a resin molding upper mold 40, connected with one another through a single flat surface 44. Each of these cavities serves to form a periphery 43 surrounding a surface mount type piezoelectric vibrator 31. On the lead frame 20, the longitudinal directions of the lead sections for the dummy terminal 32 and electrode terminal 33 and the cavities are directed toward the side frame 22 while the piezoelectric vibrators are arranged in the direction of the section bar. The upper mold 40, where cavities 42 are connected with one another through a single flat surface 44, is located among frame areas 26 for surface mount type piezoelectric vibrator 31 arrangement on the lead frame 20, which are partitioned by side frames 22 and section bars 23. The upper mold 40 is brought into contact with the lower mold 41 to form peripheries 43 surrounding surface mount type piezoelectric vibrators 31. This then results in the formation of resin-molded surface mount type piezoelectric vibrators 31 on the lead frame 20, as shown in FIG. 22.

Figure 24:
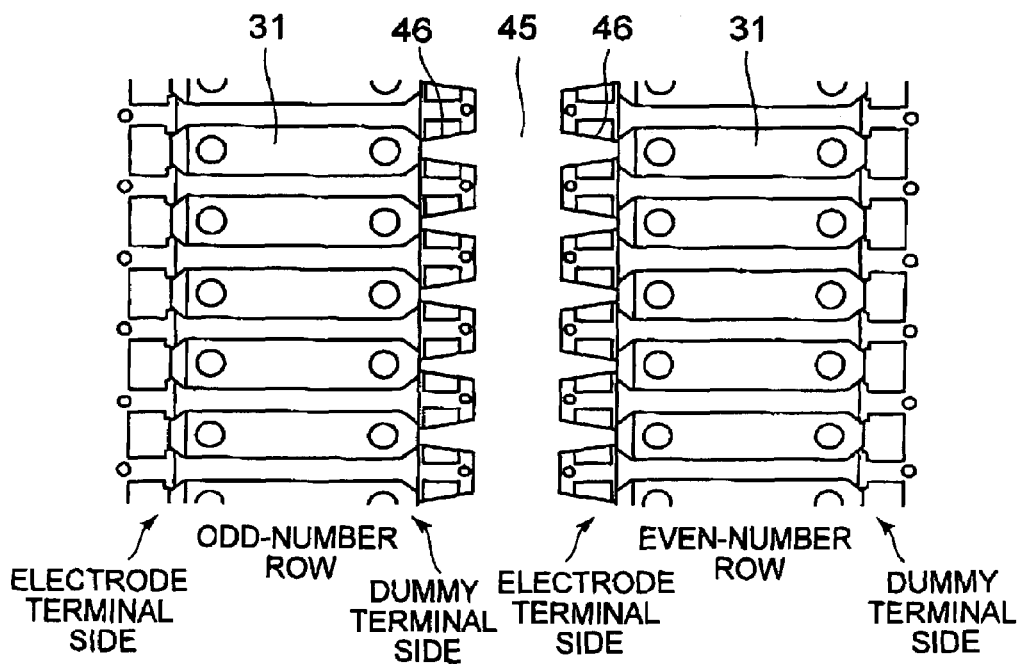
FIG. 24 is a schematic plan view for describing the resin mold construction of FIG. 23.

The longitudinal directions of the lead sections for the dummy terminal 32 and electrode terminal 33 and the cavities are directed toward the side frame while the piezoelectric vibrators are arranged in the direction of the section bar. Runners 45 for feeding molding resin in the resin molding process are therefore arranged at a right angle to the longitudinal direction of the lead frame 20, as shown in FIG. 23. The runners 45 are also disposed in the middle of the section bars 23 to feed resin to surface mount type piezoelectric vibrators 31 located on both sides of the runner, as shown in FIG. 24. Injection molding ports 46 are disposed on the electrode terminal 33 side of the surface mount type piezoelectric vibrators 31 on one of opposite sides of the runner 45. The injection molding ports 46 are also disposed on the dummy terminal 32 sides on the other side of the electrode terminal 33.

Runners 45 for feeding molding resin are disposed at a right angle to the longitudinal direction of the lead frame 20, thereby causing surface mount type piezoelectric vibrators 31 to be arranged on opposite sides of the runners 45.

In FIG. 23, a first left line of 20 surface mount type piezoelectric vibrators 31 are regarded as a first line, a line on the right of the first line as a second line and a line on the right of the second line as a third line. As shown in FIG. 24, the injection molding port 46 is provided on the dummy terminal 32 side for odd-numbered lines of surface mount type piezoelectric vibrators 31 and on the electrode terminal 33 side for even-numbered lines. If the direction made by the dummy terminal 32 side and the electrode terminal 33 side is defined as a back-and-forth direction of the surface mount type piezoelectric vibrator 31, injection molding ports 46 are in different back-and-forth directions for odd- and even-numbered lines of surface mount type piezoelectric vibrator 31.

On the lead frame 20, there are no frame bars for reinforcement of a conventional lead frame around the periphery 43 surrounding the surface mount type piezoelectric vibrator 31. Therefore, the upper mold 40 or the lower mold 41 for resin molding need not be placed astride the frame 63 for supporting a conventional section bar 62 and a lead terminal. Thus, runners 45 are disposed with good space efficiency and surface mount type piezoelectric vibrators 31 can be disposed in the frame area 26 with high density and with high cavity, thus allowing the accuracy of the molds to be maintained.

A surface mount type piezoelectric vibrator 31 will be described below with reference with FIG. 25.

Figure 25:
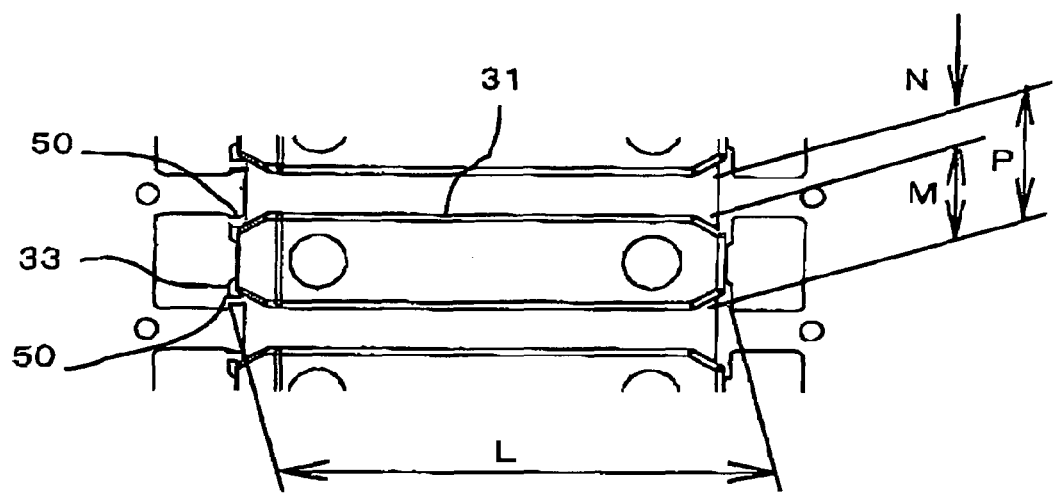
FIG. 25 is a schematic perspective view for describing a cut portion of the lead frame according to the first embodiment.

FIG. 25 is an enlarged plan view of a resin-molded surface mount type piezoelectric vibrator 31 of FIG. 23. Symbol L depicts a length. Symbol M depicts a width. Symbol N is a dimension of an adjacent surface mount type piezoelectric vibrator 31. Symbol P depicts a pitch. In the embodiment, the surface mount type piezoelectric vibrator 31 has a length L of 6.9 mm and a width M of 1.4 mm. The pitch P between surface mount type piezoelectric vibrators 31 is 2.0 mm. Therefore, symbol N is 0.6 mm. The dimension N between surface mount type piezoelectric vibrators 31 is 0.6 mm, smaller than the width M 0.8 mm and smaller the outside diameter of a sealing tube 5 of a piezoelectric vibrator 6 before resin molding. The height of the surface mount type piezoelectric vibrator 31 (not shown) is 1.4 mm. As described above, the surface mount type piezoelectric vibrator 31 has a width M that is about ⅕ a length L. The pitch P is as small as possible and surface mount type piezoelectric vibrators 31 are arranged with high density in the frame area 26 on the lead frame 20.

Misalignment between the mold 41 for resin molding and the lead frame 20 can easily appear in the longitudinal direction of the surface mount type piezoelectric vibrator 31. The misalignment is caused by a difference in coefficient of linear expansion between the mold 41 for resin molding and the lead frame 20.

Figure 32:
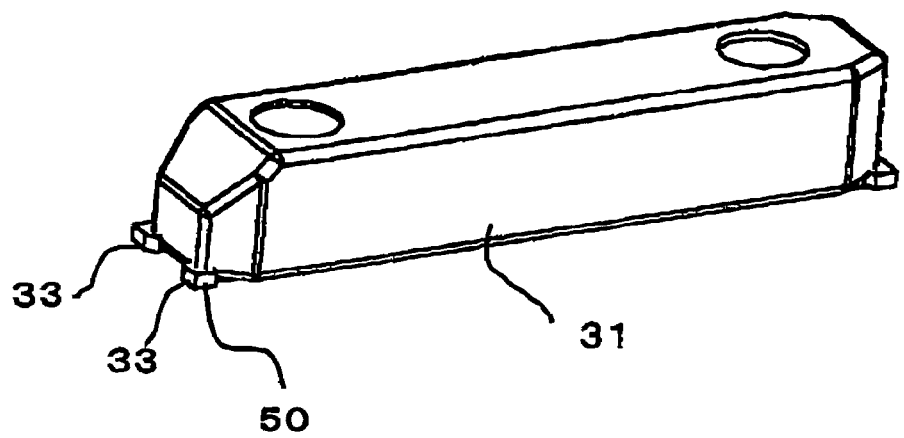
FIG. 32 is a schematic perspective view for describing a surface mount type piezoelectric vibrator.
Figure 33:
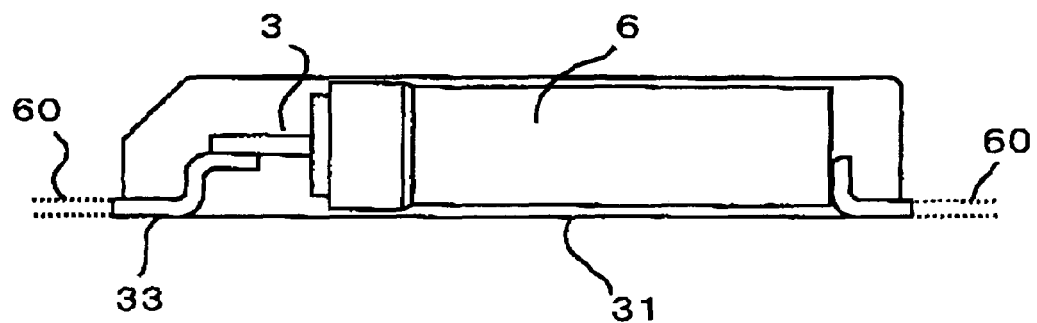
FIG. 33 is a schematic cross sectional view for describing FIG. 32.
Figure 34:
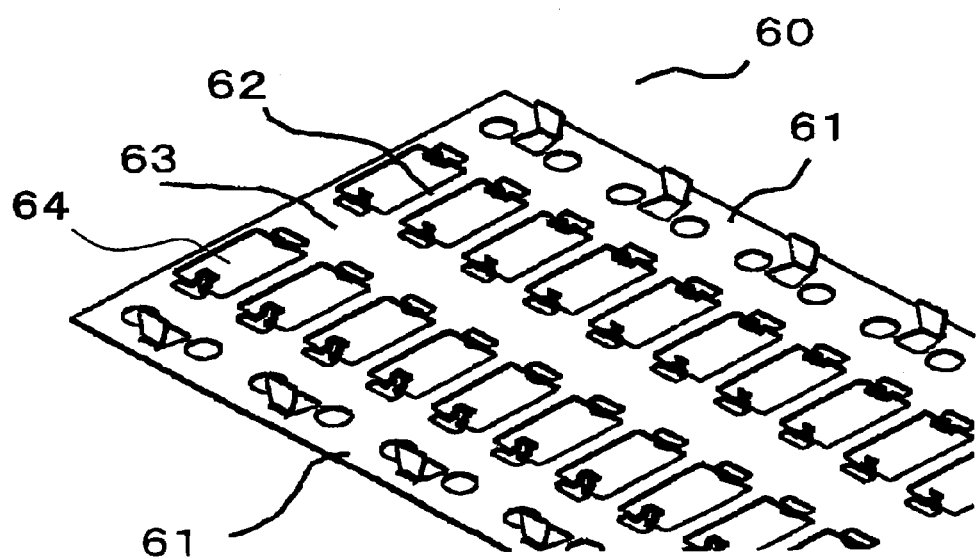
FIG. 34 is a schematic perspective view of a conventional lead frame.
Figure 35:
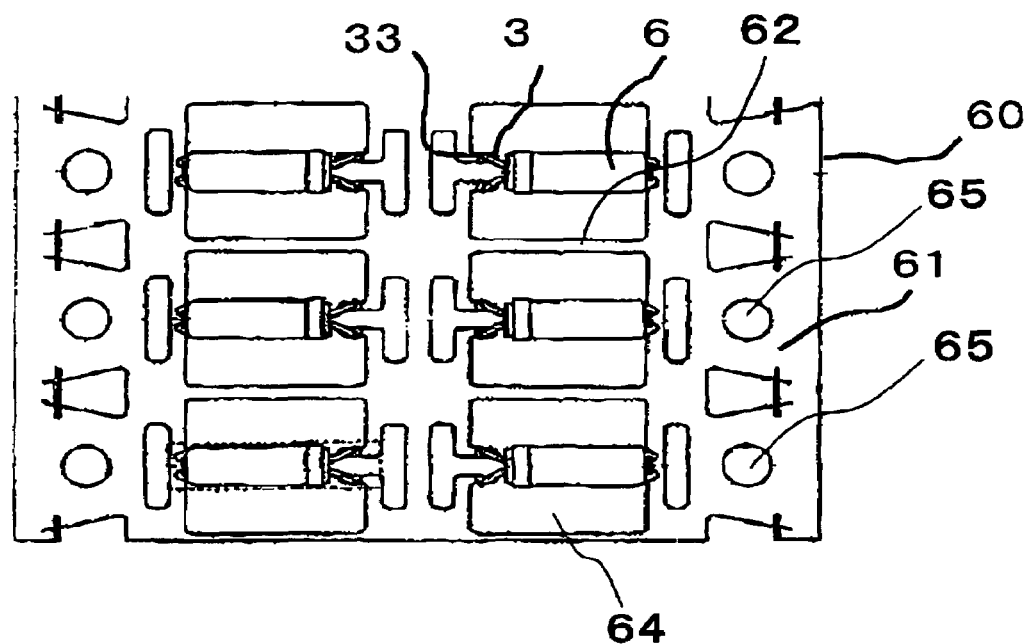
FIG. 35 is a schematic enlarged perspective view for describing piezoelectric vibrator arrangement on a conventional lead frame.
Figure 36:
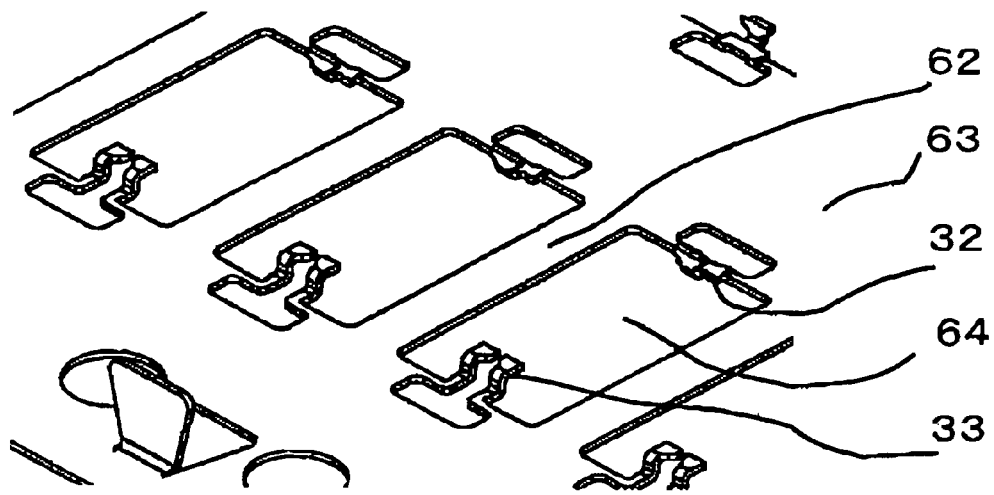
FIG. 36 is a schematic enlarged perspective view for describing FIG. 34.
Figure 37:
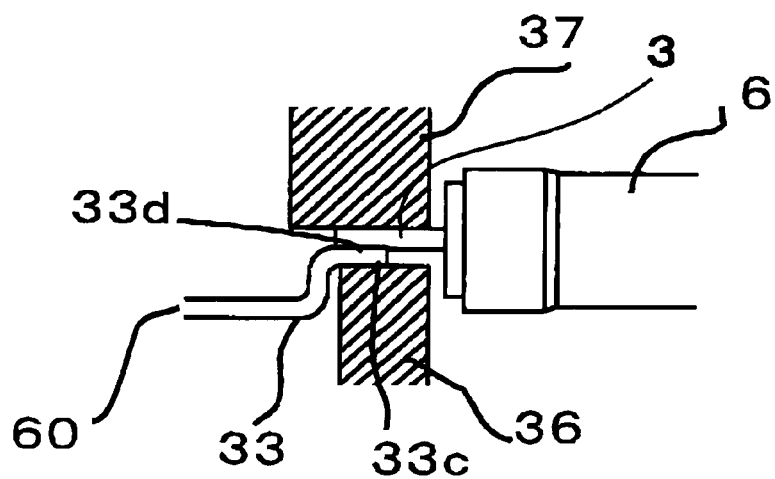
FIG. 37 is a schematic cross sectional view for describing a conventional boding process.
Figure 38:
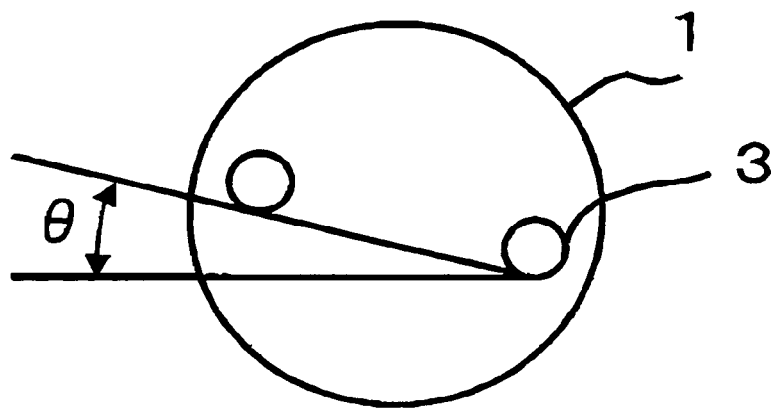
FIG. 38 is a schematic front view for describing FIG. 37.
Figure 39:
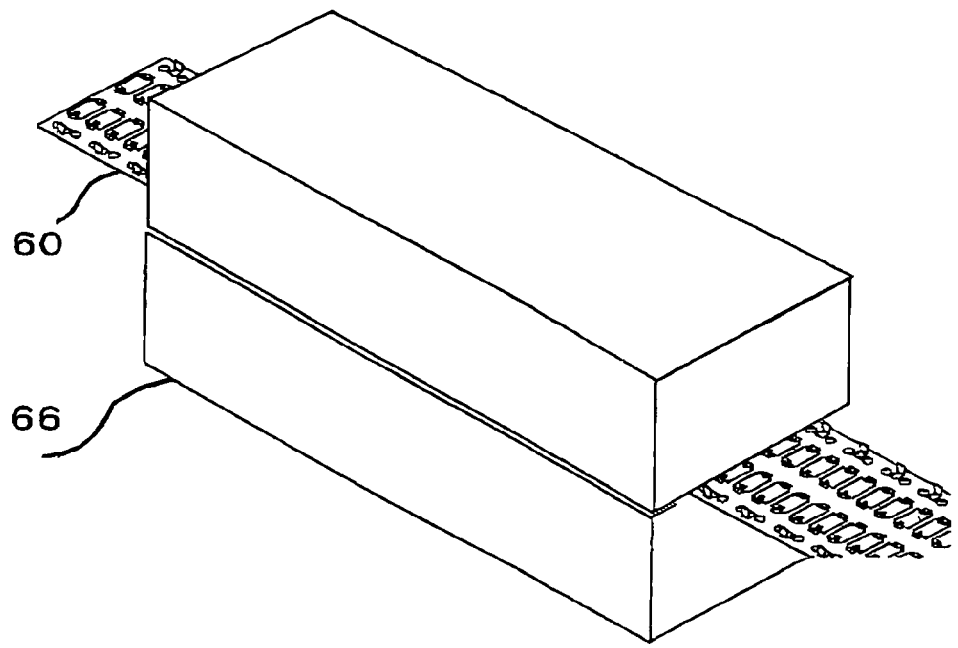
FIG. 39 is a schematic enlarged perspective view for describing a conventional lead frame and mold shape arrangement.
Figure 40:
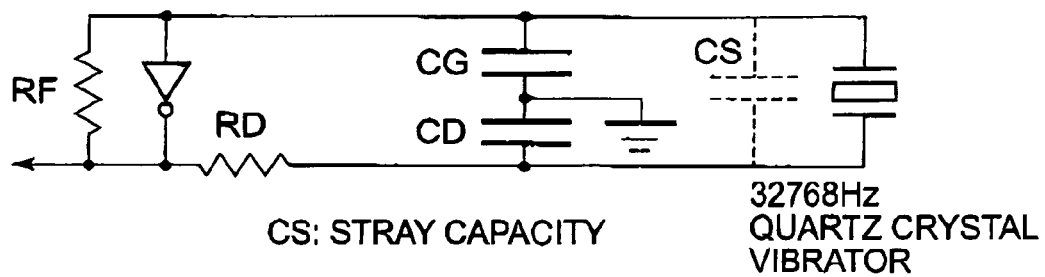
FIG. 40 is a diagram of an oscillation circuit for a piezoelectric vibrator.
Figure 41:
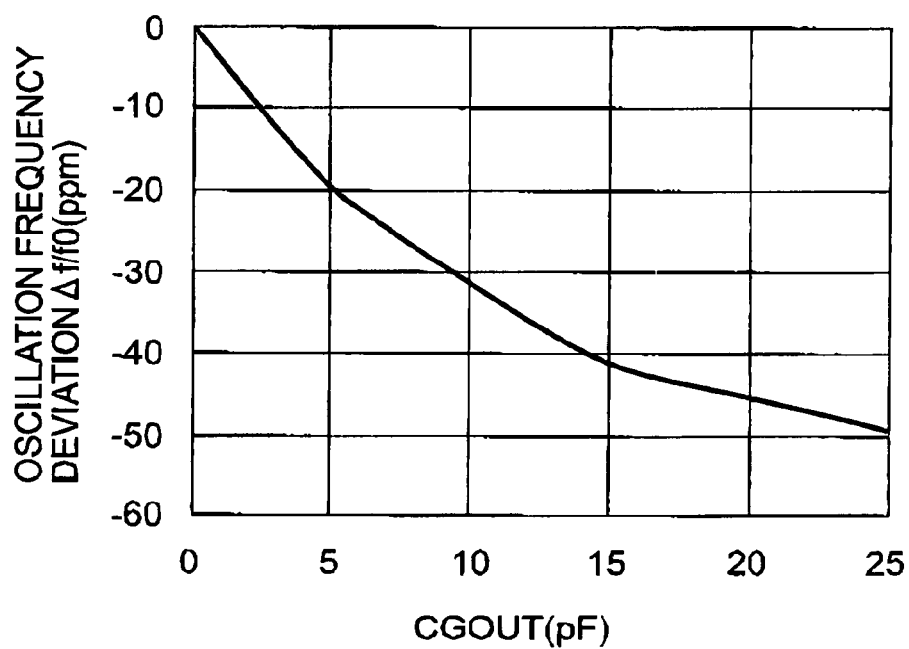
FIG. 41 is a graph showing a relation between piezoelectric vibrator load capacity and frequency deviation.

Center misalignment, which appears in the longitudinal direction of the side frame, is caused to appear in the misalignment-insensitive longitudinal direction of the surface mount type piezoelectric vibrator. For the contour of the surface mount type piezoelectric vibrator 31, the end 50 of the electrode terminal 33 to be cut is shaped like a slant face, as shown in FIG. 32, which can prevent a cutting punch from coming into contact with molding resin. Therefore, resin chipping can be eliminated, which is caused by lead cutting in the process of cutting the dummy terminal 32 and the electrode terminal 33 due to center misalignment in the surface mount type piezoelectric vibrator 31.

In the resin mold construction according to the embodiment, a surface mount type piezoelectric vibrator 31 has characteristically a width M that is ⅓ to ⅕ smaller than the length L thereof. Each of the surface mount type piezoelectric vibrator has two-directional terminals: one terminal functions as an electrode terminal 33 and the other is an electrically completely independent dummy terminal 32. The surface mount type piezoelectric vibrators can be arranged on the section 23 bar having a minimum configuration with no wasteful frame, in a matrix with high density over the entire lead frame 20. This is preferable for bringing the largest possible number of electrical contact terminals into contact with the piezoelectric vibrators in the electrical test process.

As described above, by the method described above, a resin mold construction for a surface mount type piezoelectric vibrator 31 is provided that makes it possible to simultaneously measure and test more of a plurality of surface mount type piezoelectric vibrators 31 all together quickly for low costs without resin chipping depending on molding material in the lead terminal portion cutting process, which results from the resin molding process, and without complicating resin molding molds with higher cavity density.

[Electrode Terminal Portion Cutting Process]

The resin molding process is followed by the electrode terminal portion cutting process. The electrode terminal portion cutting process will be described below referring back to FIGS. 12 and 13.

As shown in FIG. 12, through holes 29 are provided on a centerline connecting the center of a first lead section 24 and a center of the second lead 25 in the lead frame 20 according to the embodiment. In the electrode terminal portion cutting process, slits are first cut in response to the number of through hole 29, each of which is open in a frame area 26 with the through hole 29 as an end point.

FIG. 13 is a plan view showing a plurality of slits 30 cut in the lead frame 20. In FIG. 13, the contour of surface mount type piezoelectric vibrator 31 already arranged and fixed are shown in a dashed line to clearly show the shape of the lead frame 20.

As shown in FIG. 13, the width of the slit 30 is at least smaller than the interval at which surface mount type piezoelectric vibrators 31 are arranged and fixed and smaller than the diameter of the through hole 29.

If a slit 30 with a closed end is cut, a cutting tool on the closed end is subjected to a local load, which affects the service life of the cutting tool and makes a continued slit cutting work difficult. In the lead frame 20, however, through holes 29 are provided. Even if, therefore, slits 30 are cut from the central portion of the end of the first lead section 24 to the through hole 29, the cutting tool is not subjected to local load and slit cutting can be continued. If, similarly, slits 30 are cut from the central portion of the end of the second lead section 25 to the through hole 29, the cutting tool is not subjected to local load and slit cutting can be continued.

Slits are cut because a notch groove 47 having a V-shaped cross section may be cut in the back surfaces of dummy terminal 32 and electrode terminal 33 to be at the end of the first and second lead sections 24, 25 supported by the section bar 23, as shown in FIG. 13. The notch groove 47 is cut to reduce load resulting from later cutting. If there are no slits 30 when the notch groove 47 is cut, a surface where the notch groove 47 on the lead frame 20 can expand, thus resulting in warpage to the surface where the notch groove 47 is cut.

The slit 30 is cut from the central portion of the first lead section 24 to the through hole 29 on the lead frame 20. When a notch groove 47 is cut, resulting lead from 20 deformation is therefore absorbed as local deformation in the thinned the first and second lead sections 24, 25, thus making it possible to prevent warpage to a surface the notch groove 47 is cut over the entire lead frame 20.

As shown in FIG. 13, if a notch groove 47 is cut where the tips of the adjacent first and second lead sections 24, 25 are connected to each other, a surface with the groove cut where the tips are connected to each other is expanded and warpage appears across the width of the lead frame 20 on the groove cutting surface side as harmful effect of notch groove cutting. Any warpage in the lead frame 20 makes it impossible to properly proceed with subsequent processes if the lead frame 20 is carried and aligned by means of a machine. A slit is therefore cut as shown in FIG. 13 so that any expansion of a notch groove 47 cutting surface where the tips are connected to each other is absorbed by the slit to prevent warpage across the width of the lead frame 20. For the above reason, slits 30 are cut in the electrode terminal portion cutting process before notch grooves 47 are cut As shown in FIG. 13, notch grooves 47 are then cut between a lower electrode terminal 33b and where slits are cut. After notch groove 47 cutting, soldering work is performed.

After soldering, electrode terminals 33 are then cut off from the lead frame with dummy terminals 32 left on the lead frame 20. As shown in FIG. 25, cutting is done to form a terminal cut portion 50 in a position corresponding to the notch groove 47 on the surface of the lead frame 20 and make the electrode terminal 33 electrically independent of the lead frame 20.

Cutting the electrode terminals 33 from the lead frame 20 in positions corresponding to notch grooves 47 with the dummy terminals 32 left on the lead frame 20 also allows electrical tests on the lead frame 20, which will be described later.

[Electrical Test Process]

Figure 26:
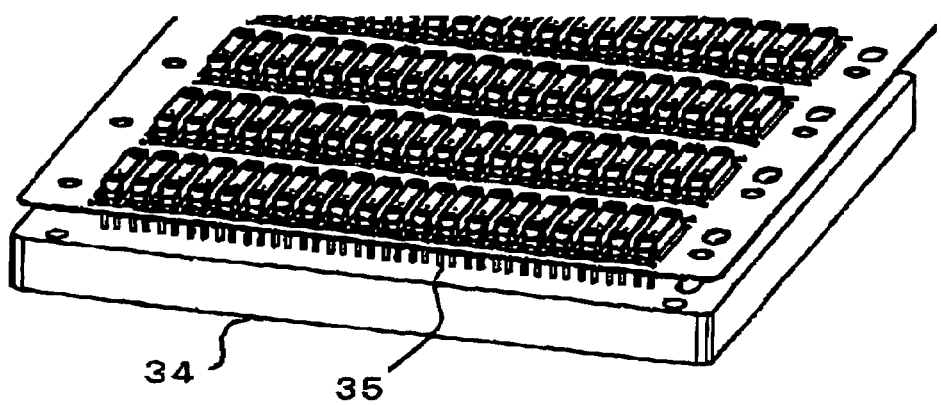
FIG. 26 is a schematic perspective view for describing the electrical test according to the first embodiment.
Figure 27:
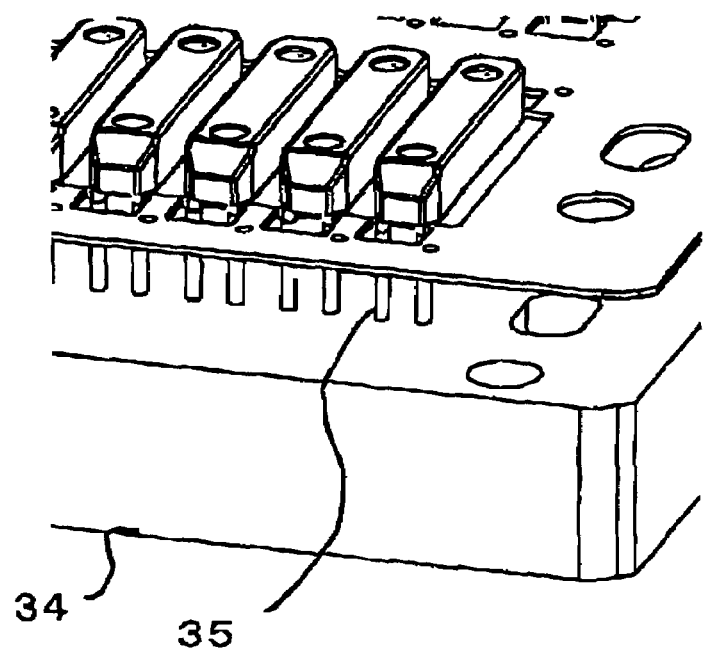
FIG. 27 is a schematic enlarged perspective view for describing FIG. 26.

FIG. 26 is a schematic perspective view for describing an example of an electrical test according to the embodiment. FIG. 27 is a partial enlarged perspective view for describing FIG. 26. Note that no slits 30 cut in the preceding process are shown on the lead frame 20 in FIGS. 26 and 27.

As shown in FIG. 9, in the lead frame preparation process, on the lead frame 20, a surface mount type piezoelectric vibrator 31 characteristically has a width that is ⅓ to ⅕ smaller than the length thereof. Each of the surface mount type piezoelectric vibrator has two-directional terminals: one terminal functions as an electrode terminal 33 and the other is an electrically completely independent dummy terminal 32. The surface mount type piezoelectric vibrators can be arranged on the section 23 bar having a minimum configuration with no wasteful frame, in a matrix with high density over the entire lead frame 20. The largest possible number of electrical contact terminals 35 can be brought into contact with the piezoelectric vibrators.

As shown in FIG. 15, in the process for bonding the outer lead 3 and the electrode terminal 33, the electrode terminals 33 are arranged on the lead frame 20 and the outer leads 3 are arranged on the carriage pallet 10, with stable positional accuracy guaranteed by the lead frame 20 and the carriage pallet 10, thus providing stable bonding.

As shown in FIG. 21, in the resin molding process, a resin mold construction with the arrangement of surface mount type piezoelectric vibrators 31 is provided that allows bringing more electrical contact terminals 35 into contact with surface mount type piezoelectric vibrators and simultaneously measuring and testing more surface mount type piezoelectric vibrators all together quickly without complicating resin molding molds 40, 41 with higher cavity density for adjacent surface mount type piezoelectric vibrators 31.

Use of the manufacturing process described above makes it possible to bring more electrical contact terminals 35 into contact with a plurality of surface mount type piezoelectric vibrators 31 formed on the lead frame 20 all together. Therefore, more surface mount type piezoelectric vibrators 31 can be measured simultaneously and quickly all together in test operations, in which must time is conventionally spent because of more measurement items for guaranteeing performance characteristics and measuring accuracy. Resulting saved time can be allocated to measurements for performance characteristic measurement items for measurement accuracy guarantee, thus making it possible to ensure a higher reliability and a higher quality in each of the lead frame preparation process, the bonding process, and resin molding process.

As shown in FIG. 25, terminal cut portions 50 are formed by separating plurality of surface mount type piezoelectric vibrator electrode terminal 33 rows resin molded with high density on the lead frame 20 shown in FIG. 16. With surface mount type piezoelectric vibrator 31 with terminal cut portions 50 formed electrically independent by the terminal cut portion 50 on the lead frame 20, electrical contact terminals 35 on an electrical test measurement block 34 are brought into contact with surface mount type piezoelectric vibrators, as shown in FIGS. 26 and 27.

Drive voltage is then applied to the electrical contact terminal 35 to cause the surface mount type piezoelectric vibrator 31 to oscillate. Electrical tests are performed on the surface mount type piezoelectric vibrators 31 formed on the lead frame 20. In other words, surface mount type piezoelectric vibrators 31 are electrically tested to distinguish acceptable electrodes and unacceptable electrodes by applying predetermined current to each of the electrode terminals 33 electrically independent on the lead frame 20.

According to results of electrical tests, identification marks are printed on the contour of the surface mount type piezoelectric vibrator 31 through a laser marker. These marks are divided into types such as load capacity as serial equivalent static capacity and frequency deviation.

Surface mount type piezoelectric vibrators 31 can identified in types, such as between load capacity as serial equivalent static capacity and frequency deviation.

Individual surface mount type piezoelectric vibrators 31 identified are then handled much more quickly in a process for mounting the surface mount type piezoelectric vibrator 31 on a tape and the like than in measurements in electrical tests. Various characteristics can also be processed quickly in terms of user applications such as high accuracy in the electrical test process.

For electrical contact terminals 35 brought into contact with surface mount type piezoelectric vibrators 31 all together, one level of oscillating drive voltage is made to alternate with another for every other surface mount type piezoelectric vibrator 31 to alternately measure every other surface mount type piezoelectric vibrator 31.

The alternate measurement described above makes it possible to test more of a plurality of surface mount type piezoelectric vibrators 31 with the electrical contact terminals 35 in contact with the surface mount type piezoelectric vibrator 31. This eliminates the necessity of repeatedly bringing an electrical contact terminals 35 into contact with each one of the surface mount type piezoelectric vibrator 31 arranged at short pitches on the lead frame 20.

The measurement of more surface mount type piezoelectric vibrator 31 allows a great reduction in time for measuring surface mount type piezoelectric vibrator 31. The measurement time reduction enables resulting saved time to be allocated to measurements for performance characteristic measurement items for measurement accuracy guarantee, thus making it possible to produced surface mount type piezoelectric vibrators 31 each having ensured reliability and quality.

After the end of measurements, dummy terminals 32 are cut to obtain individual separate surface mount type piezoelectric vibrators 31. Each surface mount type piezoelectric vibrators 31 is taped according to an identification mark thereon for shipment, which marks are classified as types such as load capacity as serial equivalent static capacity and frequency deviation.

As described above, the surface mount type piezoelectric vibrator has two-directional terminals and characteristically a width that is ⅓ to ⅕ smaller than the length thereof. These surface mount type piezoelectric vibrators are arranged on the section bar in a matrix with high density on the lead frame. The largest possible number of electrical contact terminals are brought into contact with these piezoelectric vibrators. These surface mount type piezoelectric vibrators are simultaneously measured all together with quick testing for each of the vibrators.

A plurality surface mount type piezoelectric vibrators 31 are arranged with high density. More of the surface mount type piezoelectric vibrators are simultaneously tested with electrical contact terminals in contact with the surface mount type piezoelectric vibrators without repeated electrical contact terminal contacts, and without any influence on the frequency of adjacent vibrators. Resulting saved time is allocated to measurements for performance characteristic measurement items for measurement accuracy guarantee, thus allowing reliability and quality improvements.

Second Embodiment

Figure 28:
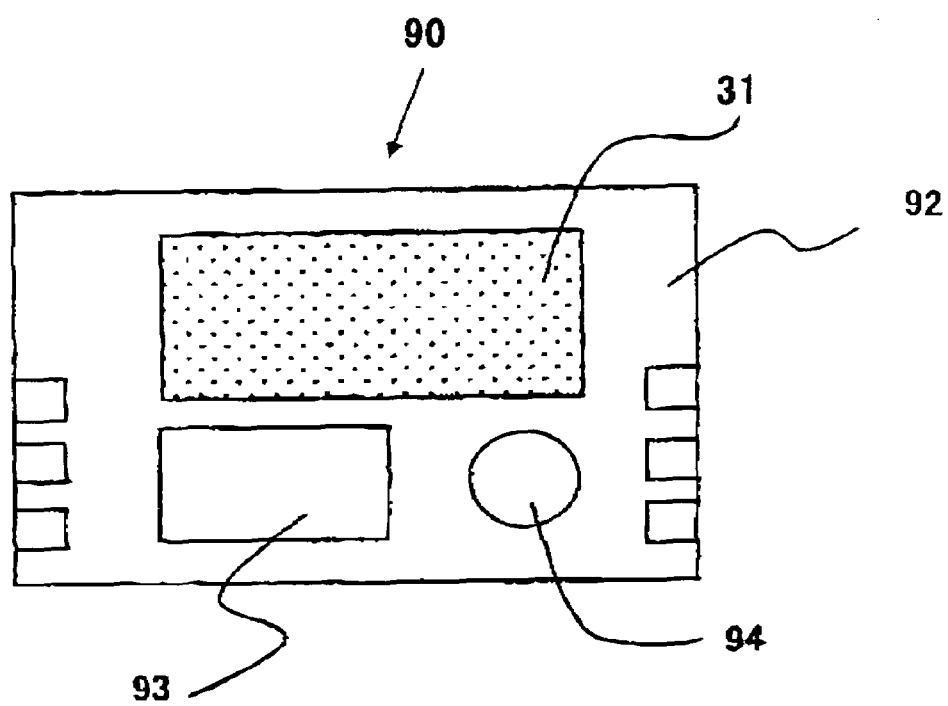
FIG. 28 is a schematic pattern diagram showing an example of the configuration of a tuning fork type quartz crystal oscillator according to a second embodiment of the invention.

A second embodiment according to the invention will be described below with reference with FIG. 28. FIG. 28 is a schematic pattern diagram showing an example of the configuration of a tuning fork type quartz crystal oscillator according to a second embodiment of the invention. The tuning fork type quartz crystal oscillator 90 uses the surface mount type piezoelectric vibrator 31 described above as an oscillation piece and is connected to an integrated circuit.

In FIG. 28, a surface mount type piezoelectric vibrator 31 is set in a predetermined position on a substrate 92 and an integrated circuit for an oscillator indicated by a reference numeral 93 is provided adjacent to the surface mount type piezoelectric vibrator 31. An electronic part 94 such as a capacitor is also mounted. These parts are electrically connected together through a wiring pattern not shown. The mechanical vibration of the vibrating piece of the surface mount type piezoelectric vibrator 31 is converted into an electrical signal due to the piezoelectric properties of a quartz crystal and input into an integrated circuit 93. In the integrated circuit 93, signal processing is performed and a frequency signal is output. The circuit functions as an oscillator. Each of these components is molded of resin not shown. A proper selection of the integrated circuit 93 provides a function to control the operating date for a single-function oscillator, and other systems of interest and external systems and to provide a user with time and calendar information.

Using the surface mount type piezoelectric vibrator 31 produced by the method according to the present invention makes it possible to further reduce the size of a vibrator having the largest volume in the oscillator and therefore the size of the oscillator. Reliability can also be maintained for a long period of time.

Third Embodiment

Figure 29:
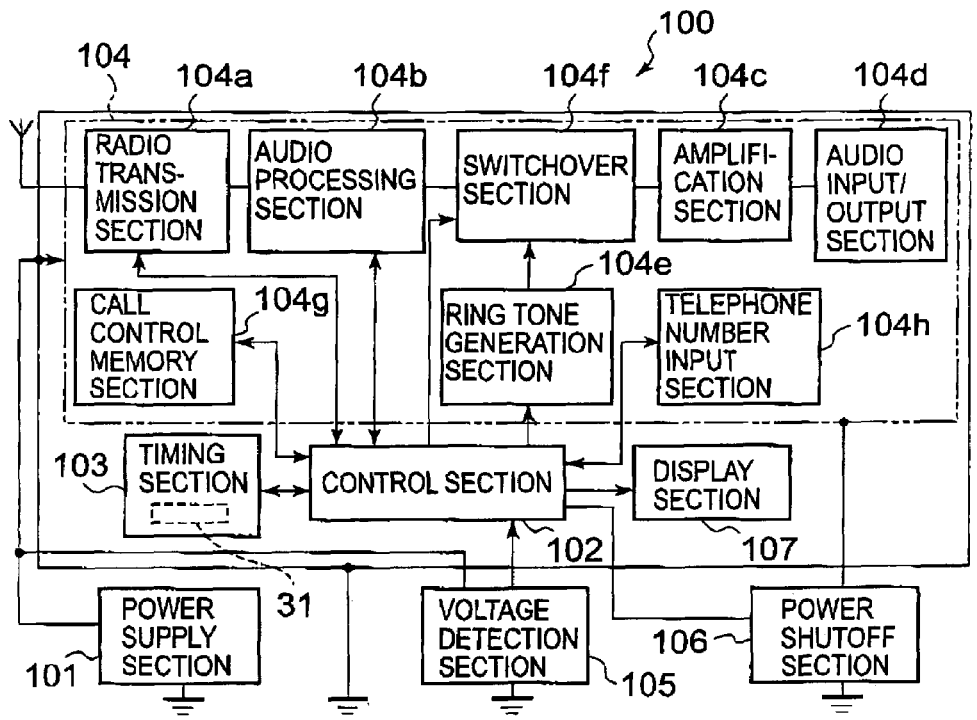
FIG. 29 is a schematic view showing one example of a block diagram for a portable information unit according to a third embodiment of the invention.

A third embodiment of the present invention will be described below. The third embodiment is an example of an electronic unit using a surface mount type piezoelectric vibrator 31 produced by the method according to the present invention with the vibrator connected to a timing section. As an example of an electronic unit, a preferred embodiment of a portable information unit represented by a cell phone will be will be described below with reference to the drawings. FIG. 29 is a block diagram functionally showing the configuration of a portable information unit according to the embodiment.

A portable information unit 100 is a developed and improved version of a watch produced by means of related art. The portable information unit is similar to a watch in appearance. The portable information unit has a liquid crystal display, instead of an hour plate, which can display current time on a screen thereof. When the portable information unit is used as a communications unit, the portable information unit is removed from the wrist. A loud speaker and a microphone each incorporated inside a band section can be used to make communications as with a cell phone produced by related art. The portable information unit is much smaller and light-weighted than a conventional cell phone.

In FIG. 29, a reference numeral 101 depicts a power supply section for supplying each of the functional sections described later with power, which section is specifically provided by a lithium ion secondary battery. A control section 102, a timekeeping section 103, a communications section 104, a voltage detection section 105 and a display section 107 are connected in parallel to the power supply section 101, all of which will be described later. Power is fed to each of these functional sections from the power supply section 101.

The control section 102 controls each of the functional sections, which will be described later, to control the operation of the entire system, such as audio data transmission and reception as well as current-timer measurement and display. The control section 102 is specifically provided by a program written into ROM in advance, a CPU for reading and executing the program, and a RAM used as a work area for the CPU, and the like.

The timekeeping section 103 is composed of an integrated circuit having built therein an oscillation circuit, an register circuit, a counter circuit, and an interface circuit and a surface mount type piezoelectric vibrator 31 as shown in FIG. 24 or 25. The mechanical vibration of the surface mount type piezoelectric vibrator 31 is converted into an electrical signal due to the piezoelectric properties of a quartz crystal and input into the oscillation circuit formed of a transistor and a capacitor. The out of the oscillation circuit is binarized and counted by the register circuit and the counter circuit. A signal is transmitted to and received from the control section via the interface circuit and current time and current date or calendar information are displayed on the display section 107.

The communications section 104 has a similar function to a related-art cell phone. The communications section 104 is composed of a radio transmission section 104a, an audio processing section 104b, an amplification section 104c, an audio input/output section 104d, an incoming sound generation section 104e, a switching section 104f, a call control memory 104g, and a phone number input section 104h.

The radio transmission section 104a transmits and receives various data to and from a base station through an antenna. The audio processing section 104b codes/decodes an audio signal inputted from the radio transmission section 104a or an amplification section 104c described later. The amplification section 104c amplifies a signal inputted from the audio processing section 104b or the audio input/output section 104d described later to a predetermined level. Specifically, the audio input/output section 104d is a speaker or a microphone and it amplifies ring tone or receiving voice or collects speaker's voice.

The incoming sound generation section 104e produces an incoming sound in response to a call from a base station. The switching section 104f switches the amplification section 104c connected to the audio processing section 104b to the incoming sound generation section 104e in the present of an incoming call so that an incoming sound produced is outputted to the audio input/output section 104d via the amplification section 104c.

The call control memory 104g stores a program related to communication incoming and outgoing all control. In addition, the phone number input section 104h is specifically composed of number keys from 0 to 9 and some other keys and input a call receiver's phone number and the like.

The voltage detection section 105 detects a voltage drop if the voltage applied by the power supply section 101 to each of the functional sections including the control section 102 falls below a predetermined value and then notifies the control section 102. The predetermined value is a value that is preset as the minimum voltage required for the stable operation of the communications section 104 and is a voltage of 3V or so, for example. If notified of a voltage drop by the voltage detection section 105, the control section 102 prohibits the operation of the radio transmission section 104a, the audio processing section 104b, the switching section 104f, and the incoming sound generation section 104e. Particularly, the stop of the operation of the radio transmission section 104a with large power consumption is essential. At the same time, the display section 107 displays a message to the effect that the communications section 104 has become unavailable due to a shortage of remaining power in the battery.

The operation of the communications section 104 is prohibited via the cooperation of the voltage detection section 105 and the control section 102. A message to that effect can also be displayed by the display section 107.

In the embodiment of the present invention, the power supply section related to the function of the communications section is provided with a selectively interruptable power supply interruption section 106, thereby making it possible to stop the function of the communications section more perfectly.

A text message may be used to display a message to the effect that the communications section 104 has become unavailable. A more visceral method for marking a phone icon with X on the display section 107, for example, may be used.

Using a small surface mount type piezoelectric vibrator 31 produced by means of a method according to the present invention in a portable information unit makes it possible to further reduce the size of the portable electronic unit, thus making it possible to keep portable electronic units reliable for a long period of time.

Fourth Embodiment

Figure 30:
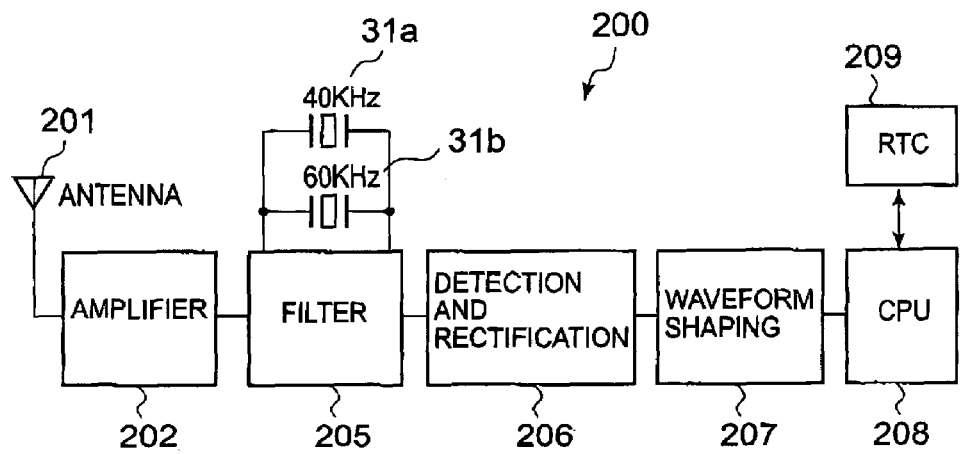
FIG. 30 is a schematic view showing one example of a block diagram for a wave timepiece according to a fourth embodiment of the invention.
Figure 31:
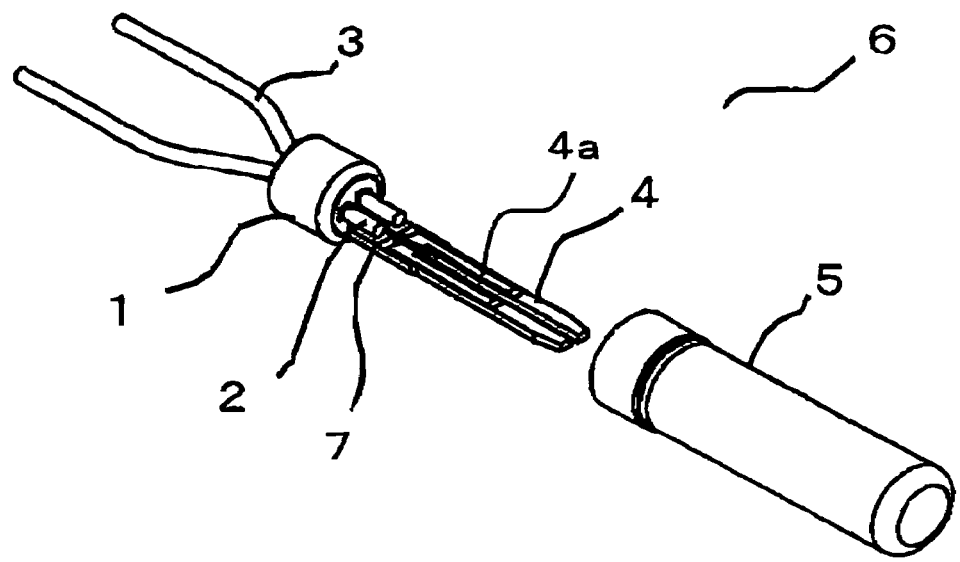
FIG. 31 is a schematic perspective view for describing a piezoelectric vibrator.

FIG. 30 is a schematic diagram showing the circuit block of a wave watch as an electronic unit according to a fourth embodiment of the present invention. The wave timepiece 201 shows an example of two surface mount type piezoelectric vibrators 31 connected to the filter section of the wave watch.

A wave watch 201 is a watch provided with a function to receive and automatically correct a standard wave including time information to an accurate time and display the correct time. In Japan there are two transmitting stations (broadcasting stations) for transmitting a standard wave: one is in Fukushima Prefecture (40 KHz) and the other in Saga Prefecture (60 KHz). A long wave of 40 or 60 KHz has both a property of propagating along the earth surface and a property of propagating reflecting to the ionized layer and the earth surface. The long wave therefore has a wide propagation range and the long waves from the above two transmitting stations together cover the entire country.

In FIG. 30, an antenna 201 receives along standard electric wave of 40 or 60 KHz. The long standard electric wave is a 40 or 60 Hz carrier wave subjected to AM modulation with time information called time code.

The long standard electric wave received is amplified by an amplifier 202 and filtered and synchronized by a filter section 205 including surface mount type piezoelectric vibrators 31a, 31b each having the same resonance frequency as the two carrier frequency. A filtered signal having a predetermined frequency is detected and demodulated by a wave detection and rectification circuit 206. A time code is taken out by a waveform formation circuit 207 and counted by a CPU 208. The CPU 208 then reads information such as the current year, accumulated days, day of the week, and time. The information read is reflected to an RTC 209 and an accurate time information is displayed.

Since the carrier has a frequency of 40 KHz or 60 KHz, a vibrator having a configuration shaped like a tuning fork is preferable for the surface mount type piezoelectric vibrators 31a, 31b which constitutes the filter section. With 60 KHz taken as an example, it is possible to configure a tuning fork type quartz crystal vibrating piece having a full length of approximately 2.8 mm and a base with a width of approximately 0.5 mm.

A surface mount type piezoelectric vibrator 31 produced by means of a method according to the present invention is connected to the filter section of the wave watch, thereby making it possible to further reduce the size of the wave watch. In addition, this allows the filter function of the wave watch to operate over a long period of time while keeping good accuracy.

What is claimed is:

1. A lead frame comprising:
a pair of side frames each having a plurality of positioning holes and spaced apart from each other in a width direction of the lead frame;
at least one section bar extending between the pair of side frames;
a plurality of first lead sections extending from the section bar and arranged at predetermined intervals along the width direction of the lead frame; and
a plurality of second lead sections extending from the section bar along the width direction of the lead frame and disposed in confronting and spaced-apart relation to the respective first lead sections in a longitudinal direction of the lead frame to define a frame area extending between the pair of side frames, each of the plurality of second lead sections having a pair of separate and independent protruding portions disposed adjacent one another.

2. A lead frame according to claim 1; wherein each of the plurality of first lead sections has adjacent tips connected to each other.

3. A lead frame according to claim 2; wherein each of the plurality of first lead sections has a protruding portion formed at a central part of the corresponding connected tips.

4. A lead frame according to claim 3; wherein the protruding portion of each of the plurality of first lead sections has a vertical portion extending upwardly from the section bar.

5. A lead frame according to claim 1; wherein the protruding portion of each of the plurality of second lead sections has a vertical portion extending upwardly from the section bar and a horizontal portion extending directly from the vertical portion.

6. A lead frame according to claim 1; further comprising a plurality of through-holes formed on respective centerlines connecting centers of the respective spaced-apart and confronting first and second lead sections.

7. A lead frame according to claim 1; wherein the respective spaced-apart and confronting first and second lead sections do not overlap one another.

8. A lead frame according to claim 1; wherein each of the plurality of second lead sections has a generally U-shaped portion in plan view, each of the U-shaped portions having a base portion and the corresponding separate and independent protruding portions extending from the base portion.

9. A lead frame comprising:
a pair of side frames spaced apart from each other in a width direction of the lead frame and extending along a longitudinal direction of the lead frame;
a plurality of frame sections extending between the side frames in spaced-apart relation along the longitudinal direction of the lead frame;
a plurality of section bars extending between the pair of side frames in spaced-apart relation along the longitudinal direction of the lead frame, the section bars being disposed between respective adjacent spaced-apart pairs of the frame sections;
a plurality of rows of first lead sections extending from the respective section bars and arranged along the width direction of the lead frame; and
a plurality of rows of second lead sections extending from the respective section bars and arranged along the width direction of the lead frame, the second lead sections in each row being disposed in confronting and spaced-apart relation to the respective first lead sections of a corresponding row of first lead sections in a longitudinal direction of the lead frame.

10. A lead frame according to claim 9; wherein each second lead section of each row of second lead sections has a pair of separate and independent protruding portions disposed adjacent one another.

11. A lead frame according to claim 10; wherein each first lead section of each row of first lead sections has adjacent tips connected to each other.

12. A lead frame according to claim 11; wherein each first lead section of each row of first lead sections has a protruding portion formed at a central part of the corresponding connected tips.

13. A lead frame according to claim 9; wherein each first lead section of each row of first lead sections has adjacent tips connected to each other.

14. A lead frame according to claim 13; wherein each first lead section of each row of first lead sections has a protruding portion formed at a central part of the corresponding connected tips.

15. A lead frame according to claim 9; wherein each first lead section of each row of first lead sections has adjacent tips connected to each other and a protruding portion formed at a central part of the corresponding connected tips.

16. A lead frame according to claim 9; wherein each second lead section of each row of second lead sections has a pair of separate and independent protruding portions disposed adjacent one another, each protruding portion having a vertical portion extending upwardly from the respective section bar and a horizontal portion extending directly from the vertical portion.

17. A lead frame according to claim 9; further comprising a plurality of through-holes formed on respective centerlines connecting centers of the respective spaced-apart and confronting first and second lead sections.

18. A lead frame according to claim 9; wherein each second lead section of each row of second lead sections has a generally U-shaped portion in plan view, each of the U-shaped portions having a base portion and the corresponding separate and independent protruding portions extending from the base portion.

19. A lead frame comprising:
a pair of side frames spaced apart from each other in a width direction of the lead frame and extending along a longitudinal direction of the lead frame;
a section bar extending between the pair of side frames;
a plurality of first lead sections extending from the section bar and arranged along the width direction of the lead frame; and
a plurality of second lead sections extending from the section bar along the width direction of the lead frame and disposed in confronting and spaced-apart, non-overlapping relation to the respective first lead sections in a longitudinal direction of the lead frame.

20. A lead frame according to claim 19; wherein each of the plurality of second lead sections has a pair of separate and independent protruding portions disposed adjacent one another; and wherein each of the plurality of first lead sections has adjacent tips connected to each other.

21. A lead frame according to claim 20; wherein each of the plurality of first lead sections has a protruding portion formed at a central part of the corresponding connected tips.

22. A lead frame according to claim 21; wherein the protruding portion of each of the plurality of first lead sections has a vertical portion extending upwardly from the section bar.

23. A lead frame according to claim 20; wherein the protruding portion of each of the plurality of second lead sections has a vertical portion extending upwardly from the section bar and a horizontal portion extending directly from the vertical portion.

24. A lead frame according to claim 20; wherein each of the plurality of second lead sections has a generally U-shaped portion in plan view, each of the U-shaped portions having a base portion and the corresponding pair of separate and independent protruding portions extending from the base portion.

25. A lead frame according to claim 19; further comprising a plurality of through-holes formed on respective centerlines connecting centers of the respective spaced-apart and confronting first and second lead sections.

* * * * *